(12) United States Patent
Hayasaki et al.

(10) Patent No.: US 7,364,839 B2
(45) Date of Patent: Apr. 29, 2008

(54) METHOD FOR FORMING A PATTERN AND SUBSTRATE-PROCESSING APPARATUS

(75) Inventors: Kei Hayasaki, Kamakura (JP); Shinichi Ito, Yokohama (JP); Tomoyuki Takeishi, Yokohama (JP); Kenji Kawano, Yokohama (JP); Tatsuhiko Ema, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 10/624,593

(22) Filed: Jul. 23, 2003

(65) Prior Publication Data

US 2004/0131980 A1 Jul. 8, 2004

(30) Foreign Application Priority Data

Jul. 24, 2002 (JP) ............... 2002-215446
Jun. 6, 2003 (JP) ............... 2003-162020

(51) Int. Cl.
*G03F 7/26* (2006.01)

(52) U.S. Cl. ............ 430/322; 430/331

(58) Field of Classification Search ......... 430/322, 430/331
See application file for complete search history.

(56) References Cited

U.S. PATENT DOCUMENTS

| 6,358,673 | B1 * | 3/2002 | Namatsu ............... 430/311 |
| 6,372,413 | B2 | 4/2002 | Ema et al. ............. 430/326 |
| 6,818,387 | B2 * | 11/2004 | Takahashi et al. ...... 430/322 |
| 2001/0018168 | A1 * | 8/2001 | Kosa et al. ............ 430/329 |
| 2003/0219660 | A1 * | 11/2003 | Ito et al. .............. 430/30 |
| 2004/0029026 | A1 * | 2/2004 | Hayasaki et al. ....... 430/30 |
| 2005/0176259 | A1 * | 8/2005 | Yokoi et al. .......... 438/745 |

FOREIGN PATENT DOCUMENTS

| JP | 60-216554 | 10/1985 |
| JP | 63-287020 | 11/1988 |
| JP | 1-179327 | 7/1989 |
| JP | 1-189123 | 7/1989 |
| JP | 2-315 | 1/1990 |
| JP | 10-300428 | 11/1998 |
| JP | 10-303114 | 11/1998 |
| JP | 2000-269120 | 9/2000 |
| JP | 2001-85407 | 3/2001 |
| JP | 2001-085407 | 3/2001 |
| JP | 2001-110711 | 4/2001 |
| JP | 2001-250773 | 9/2001 |

(Continued)

OTHER PUBLICATIONS

JPO abstract JP 1-189123, "Removing Method for Polymer Resin Film", Orita et al., Jul. 1989 (from IDS filed Jan. 10, 2005).*
Tsurumune, A. et al., "Observation Device, Ultraviolet Microscope and Observation Method", U.S. Appl. No. 10/133,626, filed Apr. 29, 2002.
Ito, S. et al., "Manufacturing System in Electronic Devices", U.S. Appl. No. 10/092,486, filed Mar. 8, 2002.

(Continued)

*Primary Examiner*—Kathleen Duda
(74) *Attorney, Agent, or Firm*—Finnegan, Henderson, Farabow, Garrett & Dunner, L.L.P.

(57) ABSTRACT

A pattern forming method comprises forming a photosensitive resin film on a substrate, exposing the photosensitive resin film, forming a pattern of the photosensitive resin film by supplying a developing solution to the photosensitive resin film, and slimming to remove a surface layer of the pattern by causing the pattern to contact with an activated water.

32 Claims, 17 Drawing Sheets

FOREIGN PATENT DOCUMENTS

| | | |
|---|---|---|
| JP | 2001-332484 | 11/2001 |
| JP | 2002-023390 | 1/2002 |
| JP | 2002-83803 | 3/2002 |
| JP | 2002-323775 | 11/2002 |
| JP | 2003-188070 | 7/2003 |
| JP | 2003-282400 | 10/2003 |
| JP | 2003-324063 | 11/2003 |
| WO | WO 99/49504 | 9/1999 |

OTHER PUBLICATIONS

Takahashi, R. et al., "Method For Forming a Pattern", U.S. Appl. No. 10/075,619, filed Feb. 15, 2002.

Ito, S. et al., "Pattern Forming Method", U.S. Appl. No. 10/411,148, filed Apr. 11, 2003.

Hayasaki, K. et al., "Substrate Treating Method, Substrate-Processing Apparatus, Developing Method, Method Of Manufacturing A Semiconductor Device, And Method Of Cleaning A Developing Solution Nozzle", U.S. Appl. No. 10/351,422, filed Jan. 27, 2003.

* cited by examiner

Start position      End position

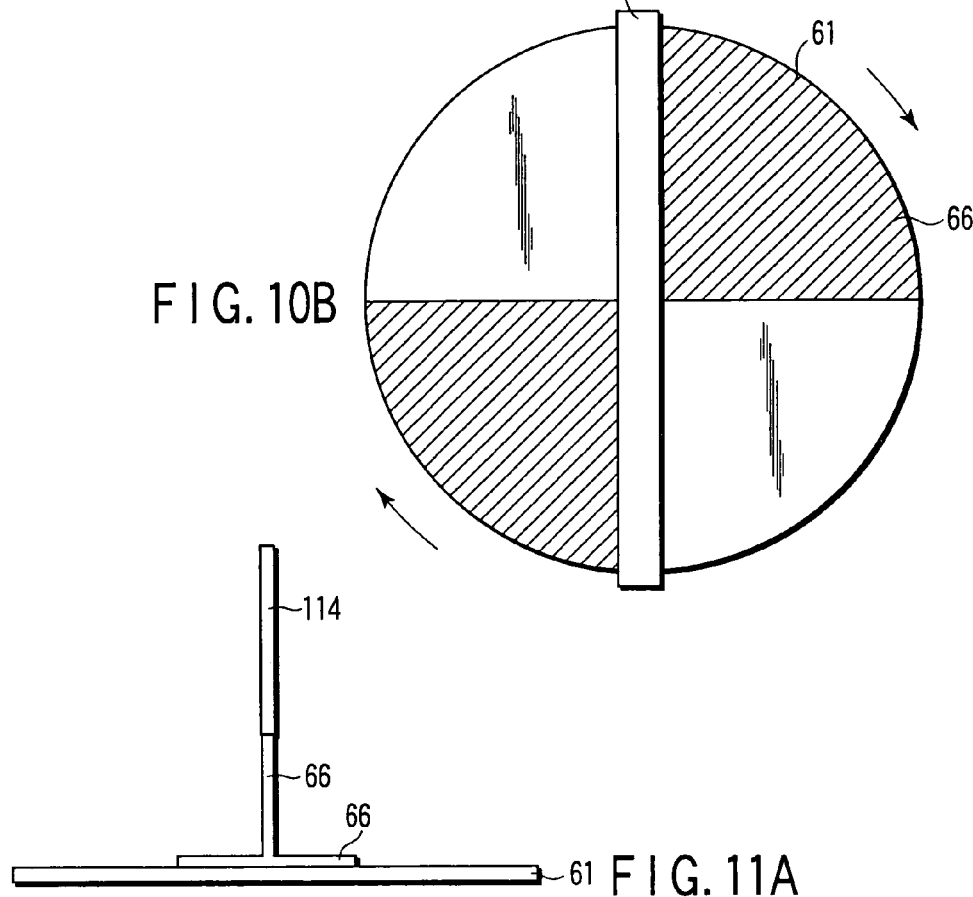
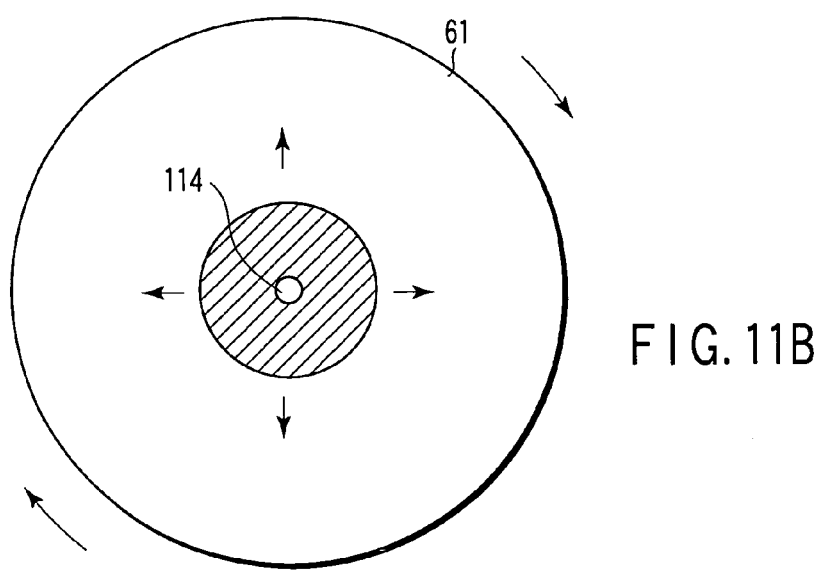

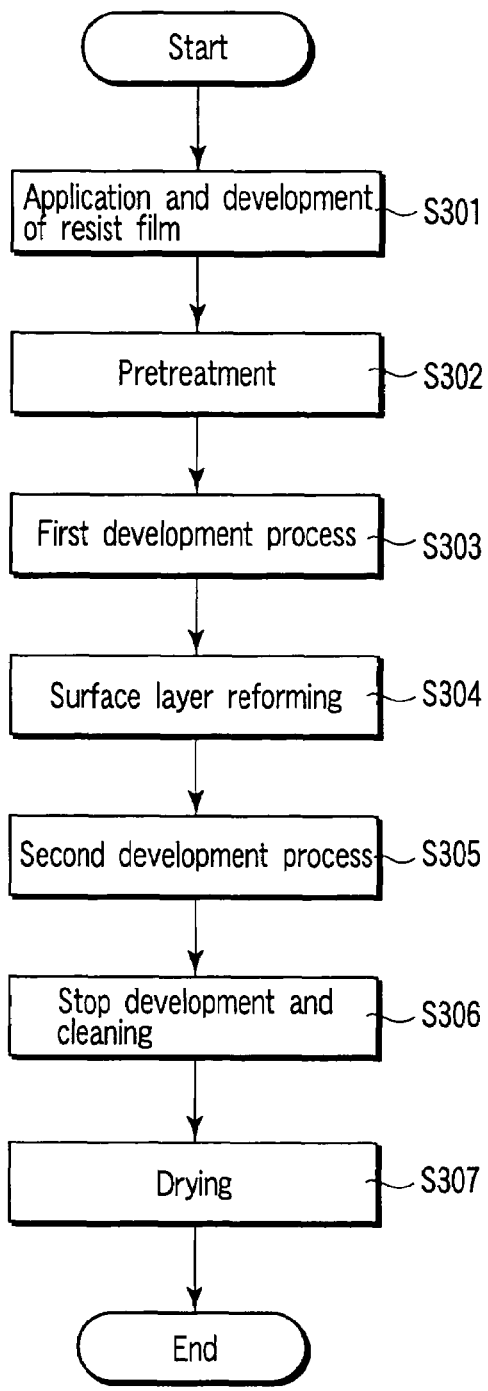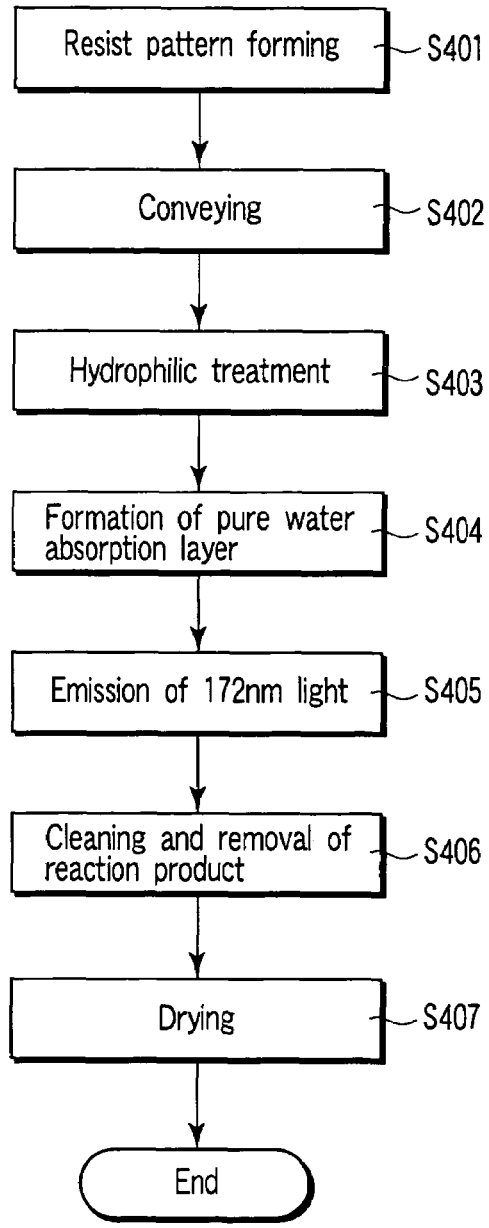
FIG. 24
FIG. 28

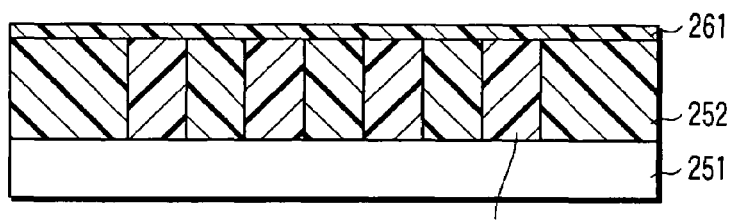
F I G. 26A
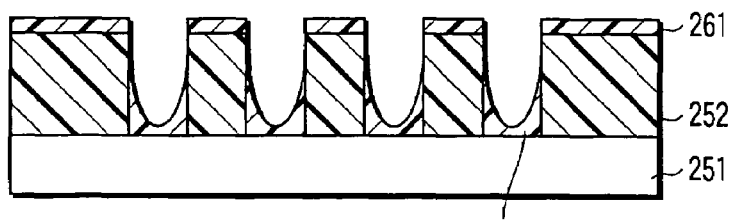
F I G. 26B

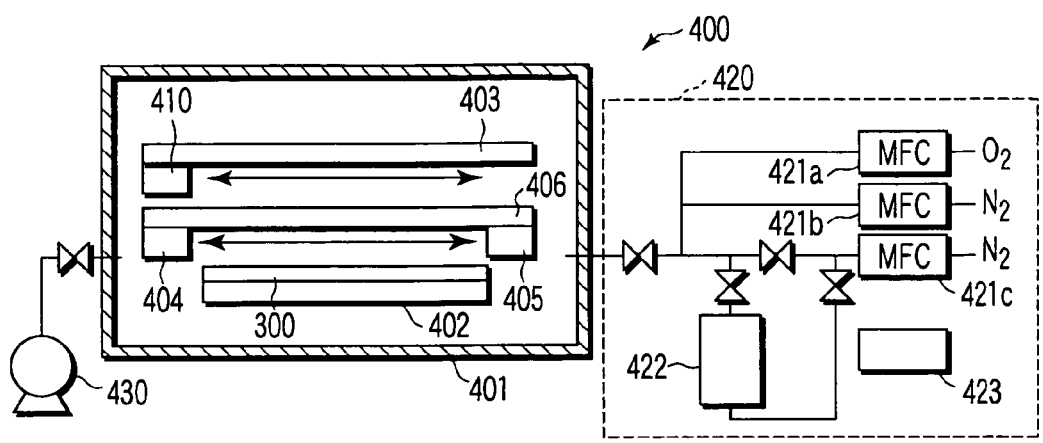
F I G. 30
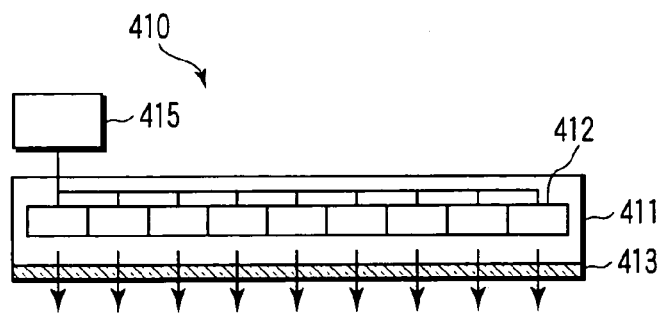
F I G. 31A
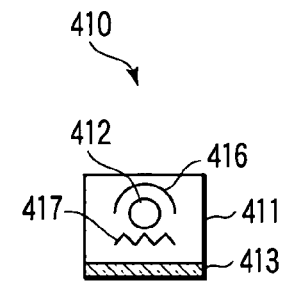
F I G. 31B
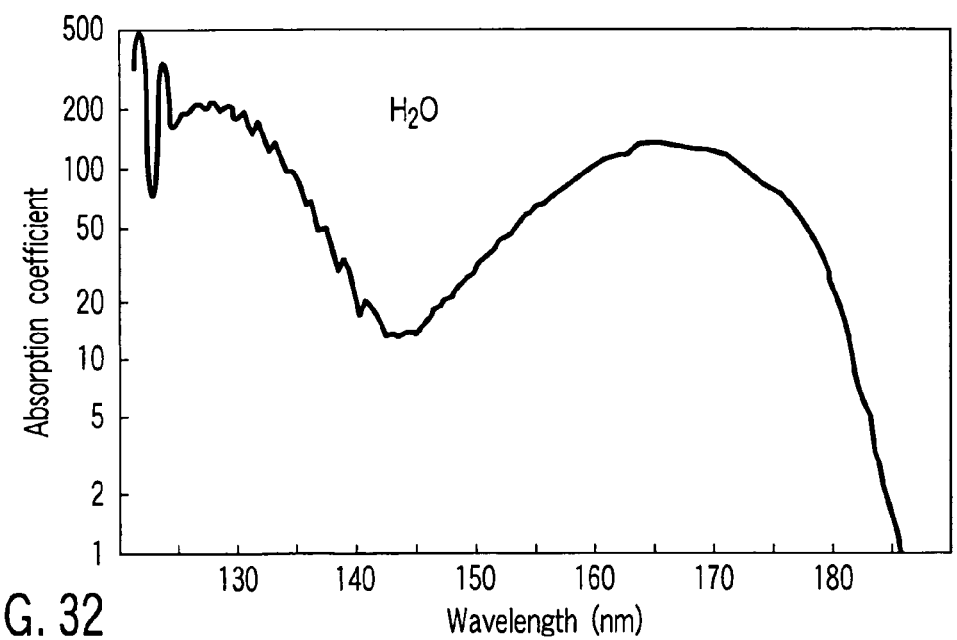
F I G. 32

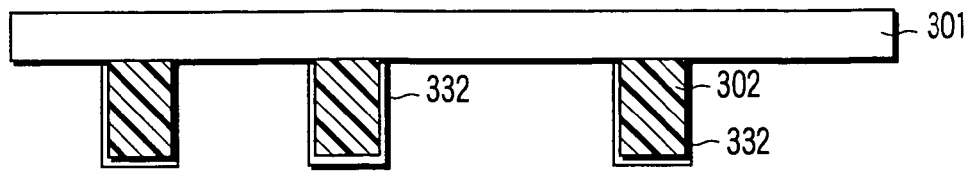
F I G. 41A
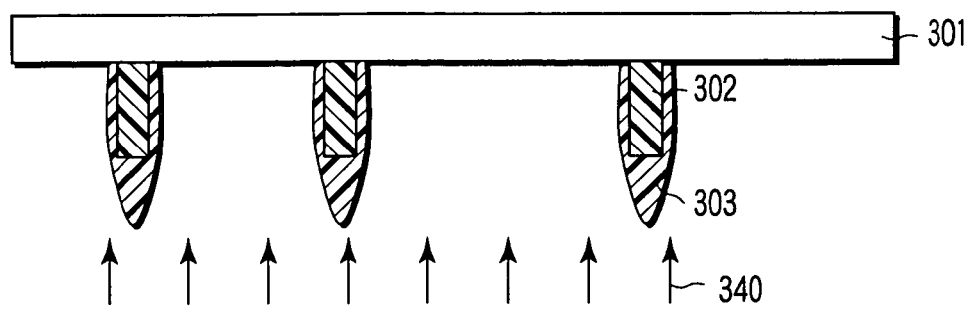
F I G. 41B
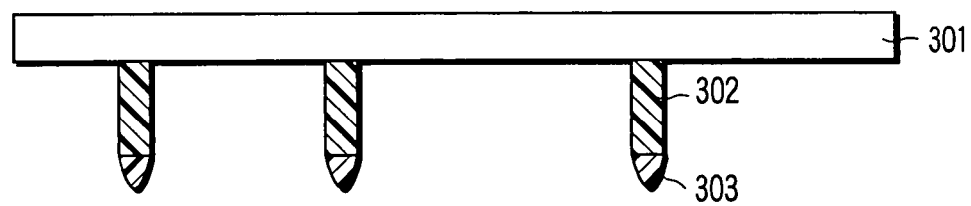
F I G. 41C
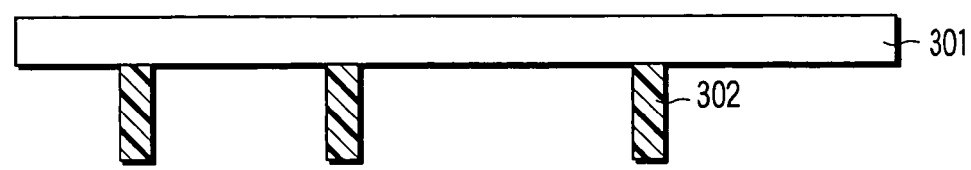
F I G. 41D

100# METHOD FOR FORMING A PATTERN AND SUBSTRATE-PROCESSING APPARATUS

CROSS-REFERENCE TO RELATED APPLICATIONS

This application is based upon and claims the benefit of priority from the prior Japanese Patent Applications No. 2002-215446, filed Jul. 24, 2002; and No. 2003-162020, filed Jun. 6, 2003, the entire contents of which are incorporated herein by reference.

BACKGROUND OF THE INVENTION

1. Field of the Invention

The present invention relates to a pattern forming method for a developing process of a photosensitive resin film formed on a substrate, and a substrate-processing apparatus.

2. Description of the Related Art

Recently, in an ultrafine processing technology, it has been required to form a very small device pattern of less than 100 nm, while a very high precision is demanded in processing. In photolithography employed in these processes, miniaturization is promoted in the background of the shortening of wavelength of an excimer laser for use in exposure from KrF to ArF and $F_2$.

However, if a pattern is formed by using such excimer laser, it is not enough to satisfy the requirement of miniaturization. A slimming process is proposed, that is, a size larger than the target is formed preliminarily by photolithography, and a resist pattern is reduced by a dry process such as dry etching or ozone ashing while emitting UV light (Jpn. Pat. Appln. KOKAI Publication No. 2001-85407), etc.

The conventional slimming process by a dry process is beneficial in the aspect of reducing the resist pattern because the etching gas has high reactivity, but there were problems in controllability of dimensions within a substrate surface or between substrates.

BRIEF SUMMARY OF THE INVENTION

A pattern forming method according to one aspect of the invention comprises: forming a photosensitive resin film on a substrate; exposing the photosensitive resin film; forming a pattern of the photosensitive resin film by supplying a developing solution to the photosensitive resin film; and slimming to remove a surface layer of the pattern by causing the pattern to contact with an activated water.

A pattern forming method according to another aspect of the invention comprises: forming a photosensitive resin film on a substrate; exposing the photosensitive resin film; forming a pattern of the photosensitive resin film by supplying a developing solution to the photosensitive resin film; reforming a surface layer of the pattern by causing the pattern to contact with an activated water; and removing the surface layer of the pattern by supplying a developing solution to the pattern.

A pattern forming method according to another aspect of the invention comprises: forming a photosensitive resin film on a substrate; exposing the photosensitive resin film; reforming a surface layer of the photosensitive resin film by causing the photosensitive resin film to contact with an activated water; and forming a pattern of the photosensitive resin film by supplying a developing solution to the photosensitive resin film of which surface layer has been reformed.

A substrate-processing apparatus according to one aspect of the invention comprises: a light emitting section including a substrate holding mechanism which holds a substrate almost horizontally and a transparent plate disposed oppositely to the substrate holding mechanism, the light emitting section emitting light to the substrate through the transparent plate; and a distance adjusting mechanism which adjusts the distance between the light emitting section and the substrate such that, when a liquid film is formed on the substrate, the transparent plate contacts with the liquid film.

A substrate-processing apparatus of another aspect of the invention comprises: a substrate holding mechanism which holds a substrate almost horizontally; a liquid supply section which supplies a liquid onto the substrate; a light emitting section which emits light before being supplied to the liquid supplied on the substrate; and a moving mechanism which moves relatively the liquid supply section, light emitting section and substrate holding mechanism horizontally.

A method of manufacturing a semiconductor device, according to one aspect of the invention comprises: forming a resin film on the principal plane of a substrate to be processed; causing the principal plane of the substrate to be processed to contact with an atmosphere containing molecules to produce OH radicals and/or O radicals when irradiated with an ultraviolet light; emitting the ultraviolet light to the principal plane of the substrate to be processed; producing OH radicals and/or O radicals from the molecules by the ultraviolet light; producing a reaction product by reaction between the produced OH radicals and/or O radicals and the resin film; and cooling the substrate to be processed to a temperature at which the resultant reaction product is not fluidized at the time of illumination with the ultraviolet ray.

A method of manufacturing a semiconductor device, according to another aspect of the invention comprises: forming a pattern of a resin film on the principal plane of a substrate to be processed; directing the principal plane of the substrate to be processed in a downward direction; causing the principal plane of the substrate to be processed to contact with an atmosphere containing molecules to produce OH radicals and/or O radicals when irradiated with an ultraviolet light; emitting the ultraviolet light to the principal plane of the substrate to be processed; producing OH radicals and/or O radicals from the molecules by the ultraviolet light; producing a reaction product by reaction between the produced OH radicals and/or O radicals and the resin film; and removing the reaction product.

A method of manufacturing a semiconductor device, according to another aspect of the invention comprises: forming a pattern of a resin film on the principal plane of a substrate to be processed; causing the principal plane of the substrate to be processed to contact with an atmosphere containing molecules to produce OH radicals and/or O radicals when irradiated with an ultraviolet light; emitting the ultraviolet light to the principal plane of the substrate to be processed; producing OH radicals and/or O radicals from the molecules by the ultraviolet light; producing a reaction product by reaction between the produced OH radicals and/or O radicals and the resin film; heating the substrate to be processed so as to evaporate the reaction product at a temperature of the resin film less than the decomposition temperature when irradiated with the ultraviolet light; and removing the reaction product after irradiation with the ultraviolet light.

A substrate-processing apparatus according to one aspect of the invention comprises: a chamber; substrate holding means provided in the chamber, for holding the substrate;

means for controlling the temperature of the substrate; means for emitting an ultraviolet light disposed opposite to the principal plane of the substrate held by the substrate holding means; gas supply means connected to the chamber, in a space between the substrate principal plane and the emitting means, for supplying a gas containing molecules to produce OH radicals and/or O radicals by irradiation with the ultraviolet ray into the chamber; gas exhaust means for exhausting the chamber, and concentration control means for controlling the concentration of the molecules contained in the gas that is supplied from the gas supply means.

BRIEF DESCRIPTION OF THE SEVERAL VIEWS OF THE DRAWING

FIGS. 10A and 10B are diagrams showing the pattern forming method according to the second embodiment.

FIGS. 11A and 11B are diagrams showing the pattern forming method according to the second embodiment.

FIG. 24 is a flowchart showing a processing procedure of a pattern forming method according to a third embodiment of the invention.

FIGS. 26A and 26B are explanatory diagrams of the action and effect of pretreatment according to the third embodiment.

FIG. 28 is a flowchart showing a processing procedure of a pattern forming method according to a fourth embodiment of the invention.

FIG. 30 is a diagram showing a configuration of a substrate-processing apparatus according to the fourth embodiment.

FIGS. 31A and 31B are diagrams showing a configuration of an emitting section of the substrate-processing apparatus shown in FIG. 30.

FIG. 32 is a characteristic diagram showing the waveform dependence of absorption coefficient of water.

FIGS. 41A to 41D are sectional views showing a method of manufacturing a semiconductor device according to a seventh embodiment of the invention.

DETAILED-DESCRIPTION OF THE INVENTION

Figure 1:
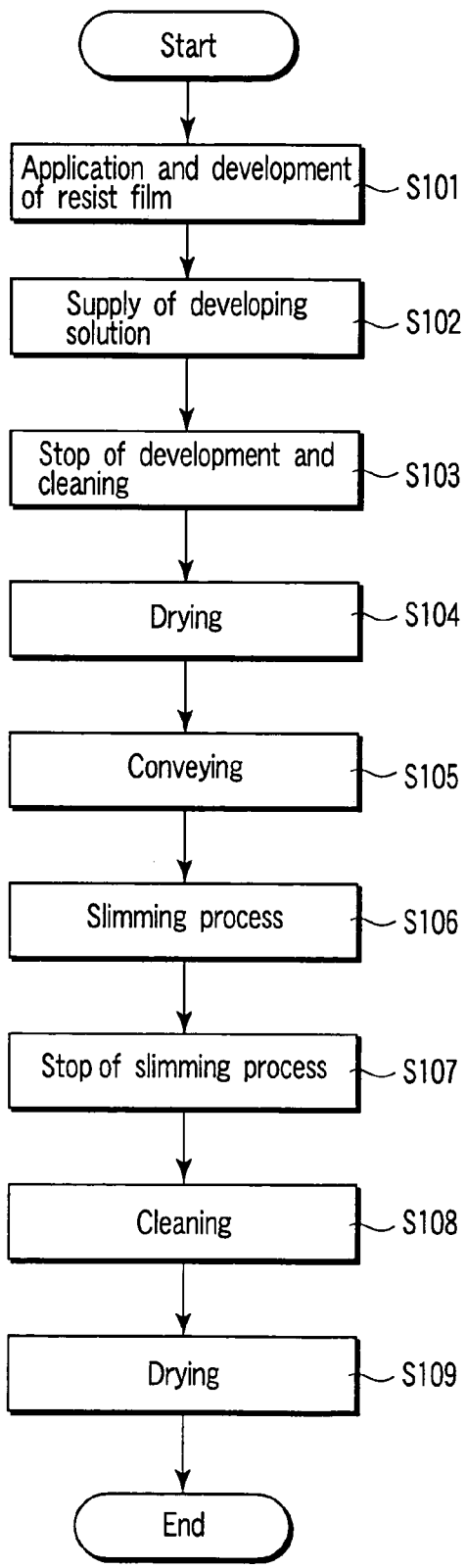
FIG. 1 is a flowchart showing a processing procedure of a pattern forming method according to a first embodiment of the invention.

Referring now to the drawings, embodiments of the invention will be specifically described below.

First Embodiment

Figure 2:
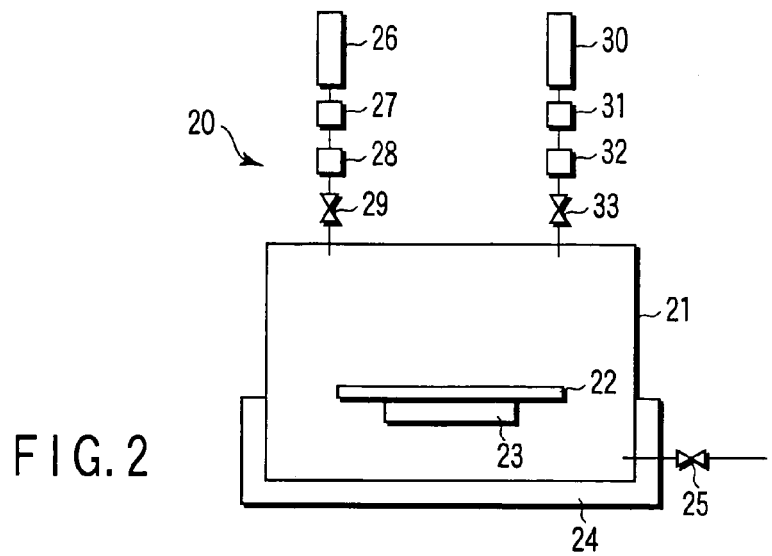
FIG. 2 is a diagram showing a configuration of a processing apparatus for realizing the pattern forming method according to the first embodiment.

FIG. 1 is a flowchart showing a processing procedure of a pattern forming method according to a first embodiment of the invention. FIG. 2 is a diagram showing a configuration of a processing apparatus for realizing the pattern forming method according to the first embodiment of the invention.

Referring to FIGS. 1 and 2, the pattern forming method according to the first embodiment of the invention will be explained below.

(Step S101)

An antireflective film and a chemically amplifying resist are applied on a substrate, for example, a semiconductor wafer. An ArF excimer laser is emitted to the chemically amplifying resist by way of an exposure reticle, and a pattern formed on the exposure reticle is exposed by reduction projection. The wafer is heated and conveyed to the developing apparatus.

(Step S102)

In the developing apparatus, a developing solution is supplied to the wafer, and a resist pattern is formed.

(Step S103)

After a predetermined period of time elapses, pure water is supplied while rotating the wafer, and development is stopped and the wafer is cleaned.

(Step S104)

The wafer is rotated at high speed and the wafer is dried.

(Step S105)

After the development process, the wafer is conveyed to a slimming process apparatus 20 shown in FIG. 2. The wafer 22 is put on a substrate holding mechanism 23 in a processing container 21.

In this slimming process apparatus 20, the resist pattern on the wafer is brought into contact with water in a supercritical state or subcritical state, and slimming is processed (the resist residual dimension is thinned out).

(Step S106)

Slimming is processed by bringing the resist pattern on the wafer into contact with water in the supercritical state or subcritical state. The procedure of the slimming process is as follows.

A valve 29 is opened, and water in the supercritical state is poured into the processing container 21 from a pure water tank 26. By operating a temperature regulator 27 and a high pressure pump 28, the pure water is set to a predetermined temperature and pressure, and pure water in the supercritical state is poured into the processing container 21.

By a temperature regulator 24, the temperature in the processing container 21 is set to a predetermined temperature. As the resist pattern contacts with supercritical water, slimming is processed. After feeding the supercritical water, the valve 29 is closed, and the temperature regulator 27 and high pressure pump 28 are stopped. After conducting slimming for a predetermined time, a pattern is finished to a desired dimension.

(Step S107)

After a predetermined time, the temperature in the processing container 21 is lowered by the temperature regulator 24. Then, the valve 25 is opened, and the slimming process is stopped. At this time, when the supercritical water returns to ordinary temperature and ordinary pressure, the temperature and pressure are controlled by the temperature regulator 24 and valve 25 such that water remains on the wafer.

(Step S108)

The wafer is cleaned. The wafer cleaning procedure is as follows. After closing the valve 25, a valve 33 is opened, and carbon dioxide in the supercritical state is poured into the processing container 21 from a carbon dioxide cylinder 30. A temperature regulator 31 and a high pressure pump 32 are operated, and the carbon dioxide is controlled to a predetermined temperature and pressure, so that the carbon dioxide in the supercritical state is poured into the processing container 21. By the temperature regulator 24, the temperature in the processing container 21 is controlled to a predetermined temperature. While pouring the supercritical carbon dioxide continuously into the processing container 21, with the valve 25 open, the supercritical carbon dioxide containing water is discharged from the processing container 21, thereby cleaning the wafer 22.

(Step S109)

After the water on the wafer 22 is completely removed, the temperature regulator 31 and high pressure pump 33 are controlled to transform the supercritical carbon dioxide directly into a gaseous state without passing an intermediate liquid state, and the wafer 22 is dried. After the wafer 22 is dried, the valve 33 is closed, and the temperature regulator 31 and high pressure pump 32 are stopped.

The action of slimming by using supercritical water will be explained.

Figure 3:
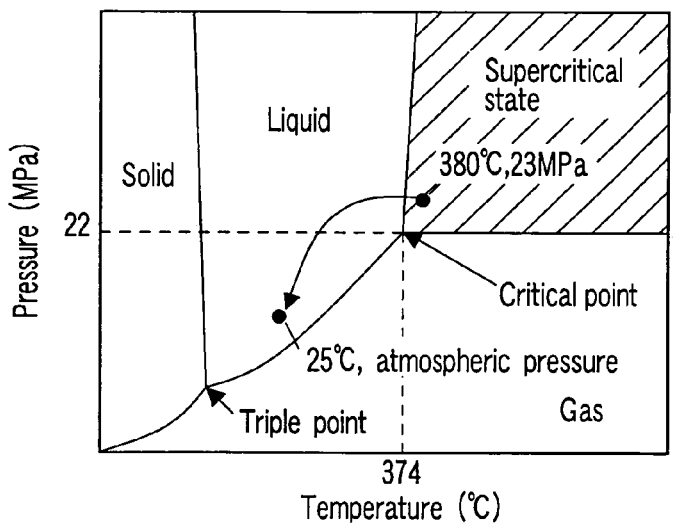
FIG. 3 is a diagram showing a phase diagram of water.

FIG. 3 shows a water phase diagram. As shown in FIG. 3, the critical point of water is 374° C., 22 MPa. Supercritical water of higher temperature and high pressure than the critical point, or subcritical water near the critical point is larger in ion volume, and reacts with an organic matter by oxidation or hydrolysis. Therefore, when the resist which is an organic matter acts with supercritical water or subcritical water, the resist is decomposed, and the residual dimension of the resist pattern decreases (slims). By setting the temperature and pressure to proper values, the reaction speed can be controlled, so that the slimming amount can be controlled. In the supercritical state, the diffusion speed of substance is faster than in a liquid state, and the diffusion of a reaction product is also quick and uniform slimming is realized in the entire wafer. Besides, since uniform oxidation decomposition reaction occurs slowly, line edge roughness can be decreased.

Action of cleaning and drying by using carbon dioxide in the supercritical state is explained.

Figure 4:
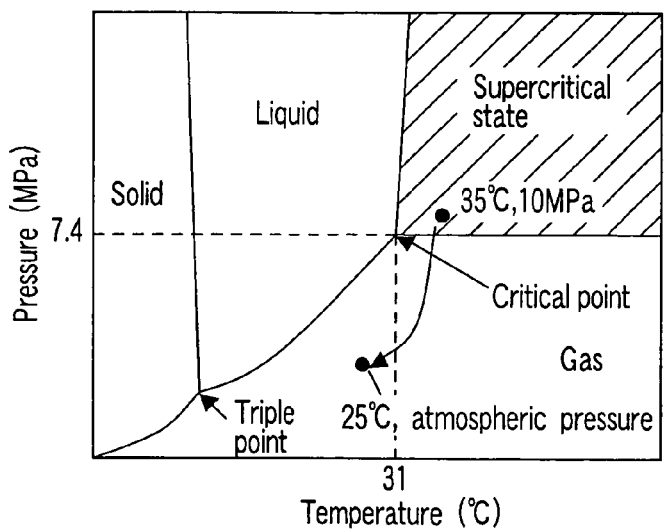
FIG. 4 is a diagram showing a phase diagram of carbon dioxide.

FIG. 4 shows a phase diagram of carbon dioxide. As shown in FIG. 4, the critical point of carbon dioxide is 31° C., 7.4 MPa. Carbon dioxide reaches a supercritical state at temperature and pressure higher than the critical point. The carbon dioxide in the supercritical state is small in viscosity and surface tension, and large in permeation into narrow gaps, and hence dissolves water. Back to ordinary temperature and pressure, it is dry, and hence it is suited to cleaning. When the liquid on the surface of a fine resist pattern having a high aspect ratio is dried in a liquid state, it is known that pattern tilting occurs. By dissolving and drying the liquid on the resist pattern surface by the gas from the supercritical state, pattern tilting can be prevented. From the viewpoint of prevention of pattern tilting, after the slimming process, it is possible to dry by transforming the supercritical water directly into a gaseous state without passing an intermediate liquid state. In this embodiment, the reaction product by slimming reaction may be left over as a defect. Therefore, it is cleaned and dried by using carbon dioxide in the supercritical state in this embodiment.

On the basis of results of experiment, the effects of the pattern forming method of the embodiment will be described below.

An antireflective film (film thickness: 50 nm) and a chemically amplifying resist (film thickness: 300 nm) are applied on a wafer. An ArF excimer laser (exposure wavelength λ: 193 nm) is emitted to the chemically amplifying resist by way of an exposure reticle, and a pattern formed on the reticle is exposed by reduction projection. The numerical aperture (NA) of the projection optical system is 0.6. The wafer is heated for 90 seconds at 120° C. It is developed for 60 seconds in an alkaline developing solution. Pure water is supplied, and the reaction is stopped, and the wafer is cleaned. In this process of lithography, an independent pattern of 100 nm remains on the wafer. In this state, fluctuations of pattern dimension were measured, and 3 nm was obtained at 3σ.

Then, the wafer is sent to the slimming process apparatus. Slimming is processed for 120 seconds by using supercritical water at 380° C., 23 MPa. As indicated by solid line in FIG. 3, returning to 25° C. and atmospheric pressure, reaction is stopped. While water remains on the wafer, the wafer is cleaned for 30 seconds by carbon dioxide in a supercritical state of 35° C., 10 MPa. After cleaning, as indicated by solid line in FIG. 4, the chamber 201 is returned to 25° C. and atmospheric pressure, and the wafer is dried.

As a result, the dimension of the independent residual pattern was 50 nm (resist film thickness: 275 nm). Fluctuations of pattern dimension were measured, and 4 nm was obtained at 3σ. In the conventional dry process, fluctuations of pattern dimension after slimming were 5 nm at 3σ. Neither resist residue nor pattern tilting was observed. As a reference sample, when dried from the supercritical state of water, a slight resist residue was noted. When 24 wafers were processed continuously, fluctuations among wafers were 2 nm at 3σ. In the conventional dry process, fluctuations among wafers were 4 nm at 3σ. Therefore, a high uniformity was obtained by slimming using critical water. Line edge roughness was half of the conventional dry process, and favorable results were obtained.

As explained herein, by slimming using supercritical water, slimming of pattern dimension is possible at excellent dimensional controllability both within the plane and among the wafers. By cleaning with carbon dioxide in the supercritical state, resist residue can be decreased. By drying the wafer from a state of introduction of carbon dioxide in the supercritical state, the resist pattern free from pattern tilting can be formed even at a high aspect ratio.

In this embodiment, pure water cleaning and spin drying are executed in the developing process, but pattern tilting may occur if the aspect ratio of the resist is high or adhesion is not excellent. Therefore, it is better that, instead of performing spin drying, the wafer is directly sent into the slimming process apparatus while a water film is left over on the surface. In this case, when setting the water in supercritical state in the processing container, the pressure and temperature must be controlled such that the water on the wafer is not evaporated.

After slimming process by supercritical water, cleaning and drying are executed by carbon dioxide in the supercritical state, but if there is no problem of pattern tilting, cleaning in liquid water and spin drying may be carried out. Or if there is no problem of resist residue, the pressure and temperature may be varied to change from supercritical water to a gaseous state of water when drying.

In this embodiment, as the slimming pattern, an example of resist pattern is shown, but the pattern is not limited to this example alone as long as the pattern dimension is slimmed by supercritical water or subcritical water. For example, a silicon nitride film pattern is also reduced in dimension.

In a practical application range, supposing the pattern dimension after the process of lithography (100 nm in this embodiment) to be L [nm], the exposure wavelength to be λ [nm], and the numerical aperture of the projection optical system to be NA, the value of N normalized by λ/NA is 1.2 or less (0.86 in this embodiment).

Second Embodiment

Figure 5:
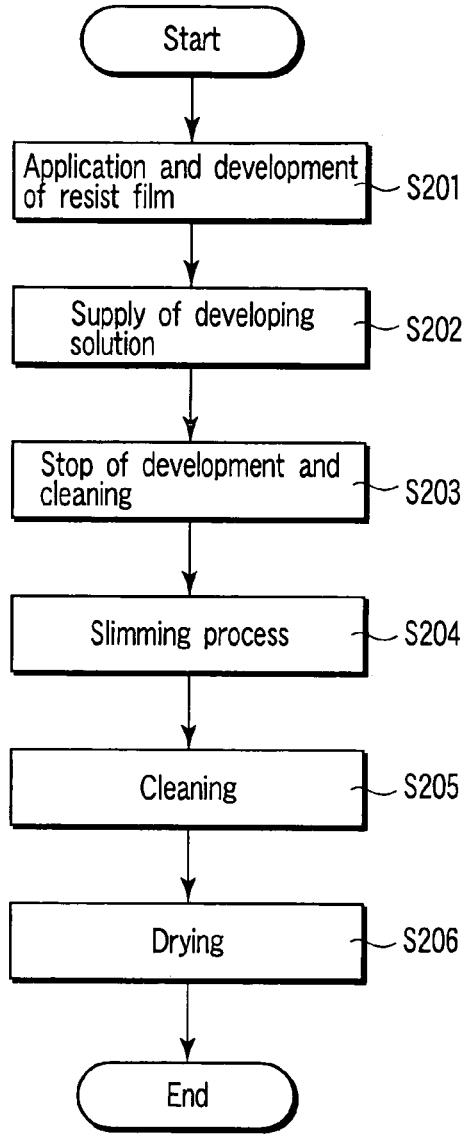
FIG. 5 is a flowchart showing a processing procedure of a pattern forming method according to a second embodiment of the invention.
Figure 6:
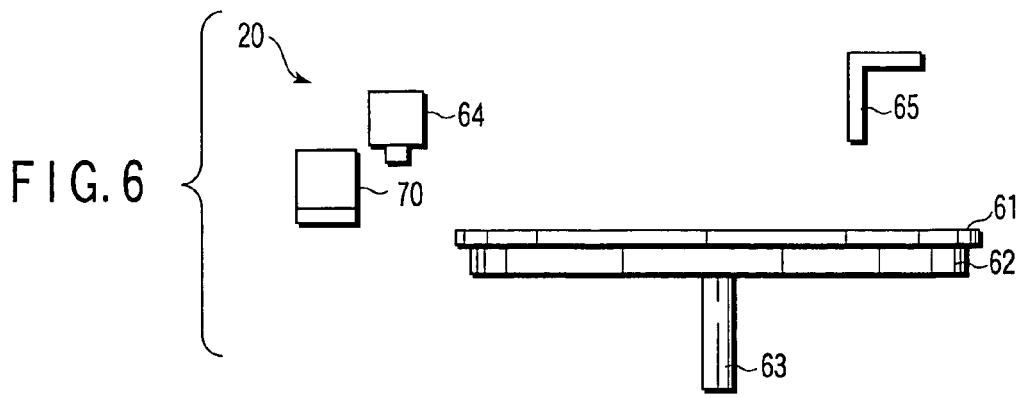
FIG. 6 is a diagram showing a schematic configuration of a substrate-processing apparatus for executing the pattern forming method according to the second embodiment.
Figure 7A:
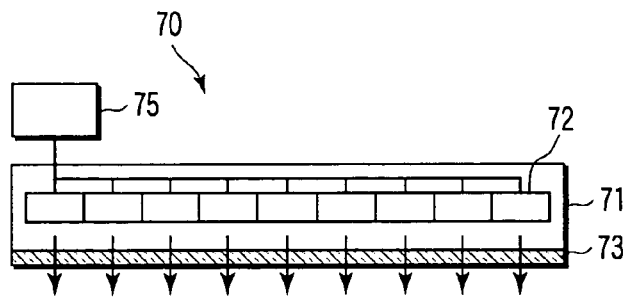
FIGS. 7A and 7B are diagrams showing a schematic configuration of a light emitting section of the substrate-processing apparatus according to the second embodiment.
Figure 7B:
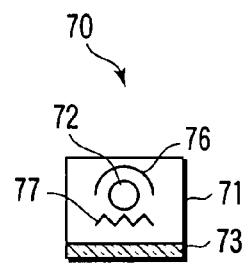
Figure 8A:
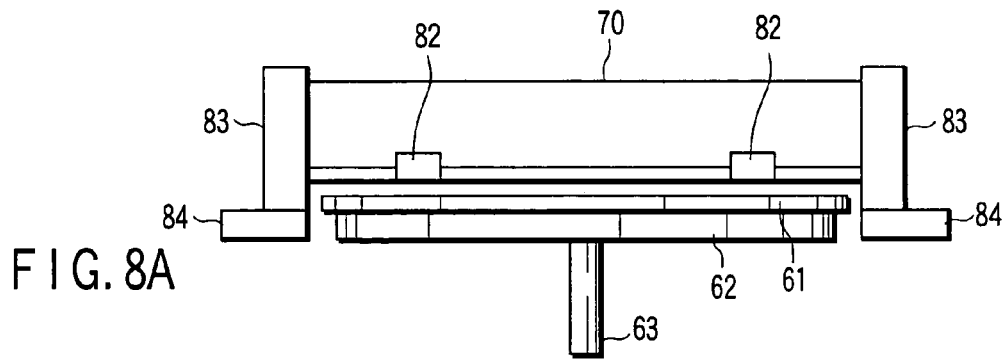
FIGS. 8A and 8B are diagrams showing a schematic configuration of the light emitting section, a moving mechanism, and a gap adjusting mechanism.
Figure 8B:
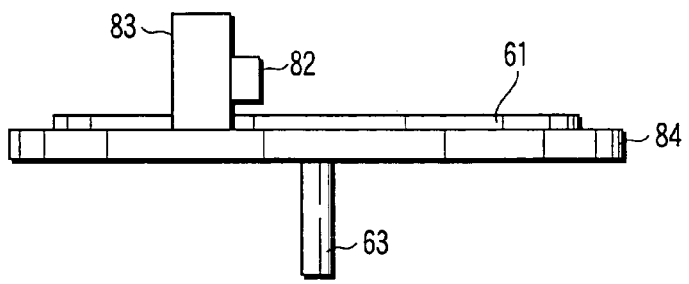

A pattern forming method according to a second embodiment of the invention will be explained by referring to FIGS. 5 to 13. FIG. 5 is a flowchart showing a processing procedure of the pattern forming method according to the second embodiment of the invention. FIG. 6 is a diagram showing a schematic configuration of a substrate-processing apparatus for executing the pattern forming method. FIGS. 7A and 7B are diagrams showing a schematic configuration of a light emitting section of the substrate-processing apparatus according to the second embodiment of the invention. FIGS. 8A and 8B are diagrams showing a schematic configuration of the light emitting section, a moving mechanism, and a gap adjusting mechanism shown in FIGS. 7A and 7B. FIGS. 9A and 9B to FIG. 13 are diagrams explaining the pattern forming method in this embodiment.

(Step S201)

An antireflective film and a chemically amplifying resist are applied on a wafer, and a desired pattern is exposed by reduction projection by way of an exposure reticle by using an ArF excimer laser. The wafer is heated and conveyed to the substrate-processing apparatus shown in FIG. 6. As shown in FIG. 6, a wafer 61 is put almost horizontally on a substrate holding mechanism 62 of the substrate-processing apparatus. The substrate holding mechanism 62 is rotated by a rotating mechanism 63 connected nearly to the center of the substrate holding mechanism 62. By rotation of the substrate holding mechanism 62, the wafer 61 rotates. The substrate-processing apparatus includes a developing solution discharge nozzle 64, a rinsing solution discharge nozzle 65, and a light emitting section 70.

The configuration of the light emitting section for emitting light to water will be explained by referring to FIGS. 7A and 7B. FIG. 7A is a front view of the light emitting section, and FIG. 7B is a sectional view of the light emitting section. FIG. 7A is a view from the scanning direction, and FIG. 7B is a sectional view in a direction orthogonal to the scanning direction.

As shown in FIGS. 7A and 7B, a plurality of lamps 72 are arranged in a lamp house 71 along a direction orthogonal to the scanning direction. A quartz glass (transparent plate) 73 is disposed in the lamp house 71 at the side facing the wafer. Power is inputted to the lamps 72 from a power input section 75. The power input section 72 supplies an electric power independently to each lamp 72, and can adjust the illumination of each lamp 72.

The lamp house 71 incorporates a reflector 76 for emitting the light from the lamps 72 efficiently to the wafer side. A diffusion plate 77 is disposed between the lamps 72 and the quartz glass 73 in order to decrease unevenness of the illumination.

The lamp is composed of the plurality of lamps 72 in order to enhance the uniformity of the illumination by adjusting the input power to each lamp, and as long as the illumination is uniform, it is not required to use divided lamps.

Excimer lamps are used as the lamps 72. The excimer lamp light includes wavelength components of 172 nm. The light of wavelength 172 nm is absorbed also by oxygen in the air. Hence, if oxygen is present in the lamp house 71, the quantity of light absorbed by water is decreased. Therefore, it is desired that the inside of the lamp house 71 is replaced with nitrogen or evacuated. The quartz glass 73 is preferred to be transparent to the emitted light.

The mechanism for holding the light emitting section 70 and the moving mechanism for moving the light emitting section 70 horizontally will be explained by referring to FIGS. 8A and 8B. FIG. 8A is a front view of the light emitting section, moving mechanism, and gap adjusting mechanism, and FIG. 8B is a side view of the light emitting section, moving mechanism, and gap adjusting mechanism.

As shown in FIGS. 8A and 8B, a gap measuring mechanism 82 is provided at the side of the scanning direction side of the light emitting section 70. The gap measuring mechanism 82 is a rangefinder using laser light. The gap measuring mechanism 82 measures the gap between the quartz glass 73 of the light emitting section 70 and the top of the semiconductor wafer 61 placed on the substrate holding mechanism 62. Since the object of measurement is the interval between the wafer 61 and the quartz glass 73, the emitting position of laser light from the gap measuring mechanism 82 may be anywhere parallel to the wafer 61, not limited to the wafer 61.

A gap adjusting mechanism 83 is disposed at both ends of the light emitting section 70. The gap adjusting mechanism 83 adjusts the interval between the quartz glass 73 and the top of the wafer 61 such that the quartz glass 73 contacts with pure water 67 on the wafer 61 on the basis of the result of measurement by the gap measuring mechanism 82. The gap adjusting mechanism 83 adjusts the interval by expansion and contraction of the piezo element.

A moving mechanism 84 moves the light emitting section 70 of which interval is held at a predetermined value by the gap adjusting mechanism 83 in the horizontal direction.

The interval between the wafer 61 and the light emitting section 70 must be kept strictly at a fixed distance. Therefore, to prevent deflection of the wafer 61, the diameter of the substrate holding mechanism 62 is preferred to be substantially same as the size of the wafer.

(Step S202)

Figure 9A:
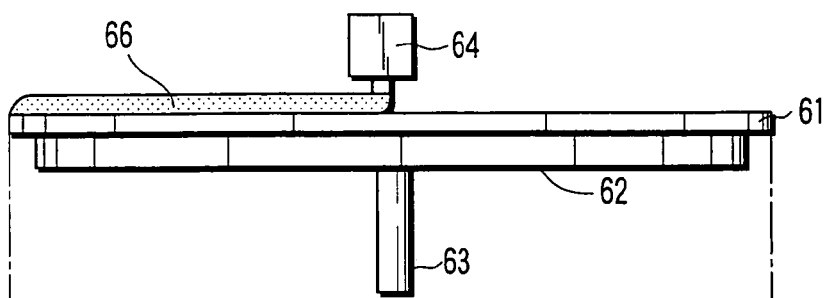
FIGS. 9A and 9B are diagrams showing the pattern forming method according to the second embodiment.
Figure 9B:
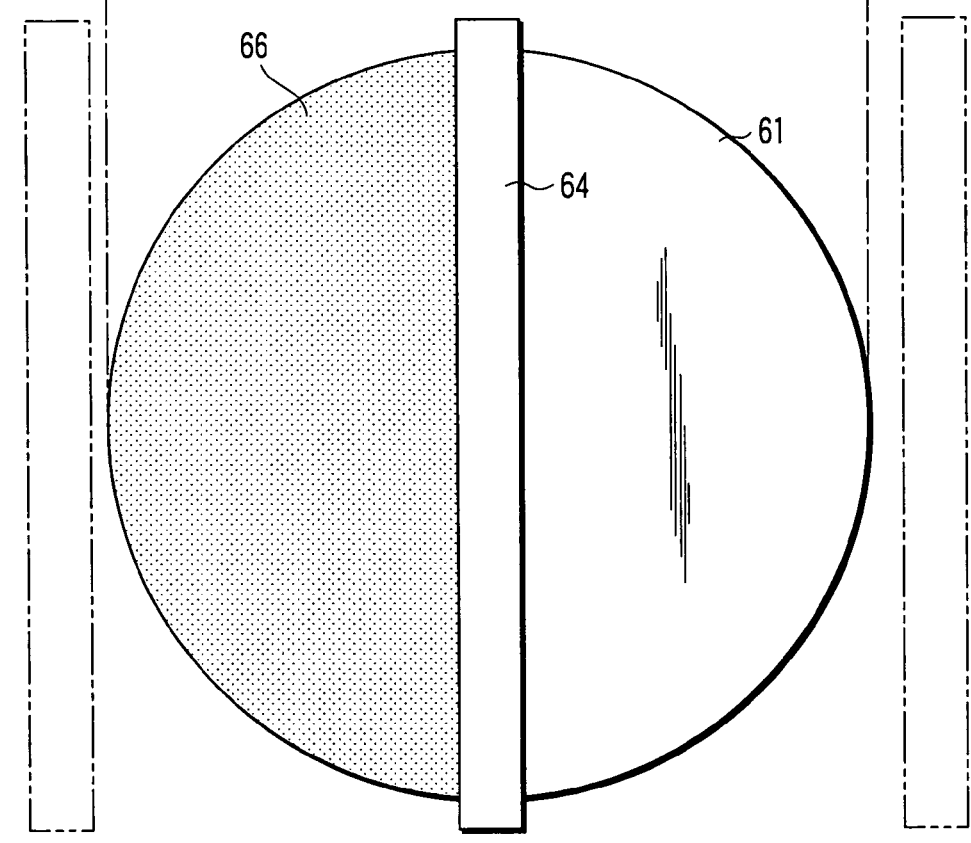

As shown in FIGS. 9A and 9B, a developing solution 66 is supplied onto the wafer 61 from the developing solution discharge nozzle 64, and the resist film is developed. FIG. 9A is a sectional view showing a developing process, and FIG. 9B is a side view showing a developing process.

Herein, the developing solution is discharged like a curtain by scanning the developing solution discharge nozzle 64 from one end to the other end of the wafer 61, so that the developing solution 66 is supplied on the wafer 61. The developing solution discharge nozzle 64 used herein has the width of the discharge port in a direction orthogonal to the nozzle scanning direction wider than the wafer diameter.

The developing solution supply mechanism has a mechanism for scanning from one end to the other end of the wafer, but same effects may be obtained by other mechanisms, such as a mechanism for supplying the developing solution while rotating a linear nozzle 104 relatively to the wafer 61 on the wafer 61 as shown in FIGS. 10A and 10B, a mechanism for supplying the developing solution on the entire surface of the wafer by rotating the wafer 61 while supplying a liquid by using a nozzle 114 of straight pipe, or a mechanism of supplying the developing solution by spraying the developing solution from the spray nozzle uniformly on the entire surface of the wafer as shown in FIG. 11. FIG. 10A is a sectional view showing the developing process, and FIG. 10B is a side view showing the developing process. FIG. 11A is a sectional view showing the developing process, and FIG. 11B is a side view showing the developing process.

(Step S203)

Figure 12:
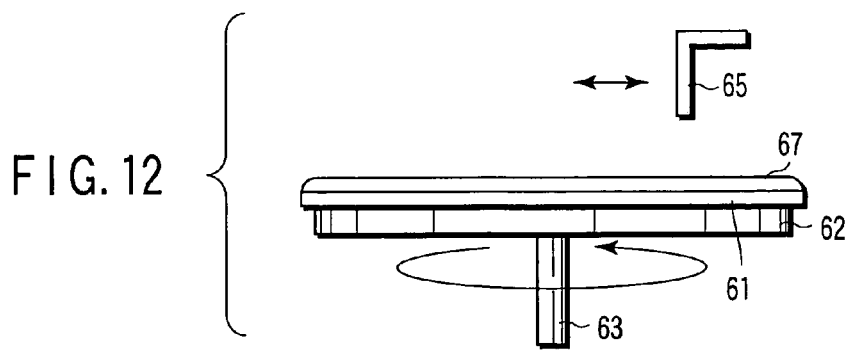
FIG. 12 is a diagram showing the pattern forming method according to the second embodiment.

After the resist pattern is formed in a predetermined developing time, as shown in FIG. 12, the pure water 67 is supplied onto the wafer 61 from the rinsing solution discharge nozzle 65, and the developing reaction is stopped, and cleaning is started. The pure water is supplied while rotating the wafer 61 by the rotary mechanism 63. After cleaning, without spin drying, rotation of the wafer 61 is stopped, and a liquid film of the pure water 67 is formed on the wafer 61, and this state is maintained.

(Step S204)

Figure 13:
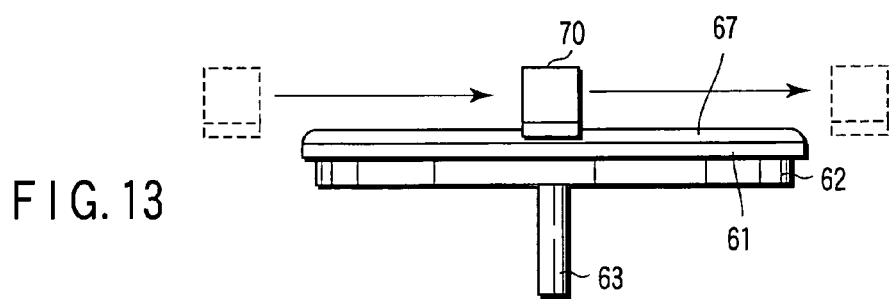
FIG. 13 is a diagram showing the pattern forming method according to the second embodiment.

In succession, in the same substrate-processing apparatus, the resist pattern is processed by slimming. In the slimming process, as shown in FIG. 13, while scanning the light emitting section 70 in one direction, light is emitted from the light emitting section 70 to the pure water on the wafer 61.

The light emitted from the light emitting section 70 includes wavelengths of 250 nm or less to be absorbed by water. When the light including wavelengths of 250 nm or less is emitted to water, active radical molecules or radical atoms are generated from water. Slimming process is executed by these radical molecules and atoms.

Figure 14:
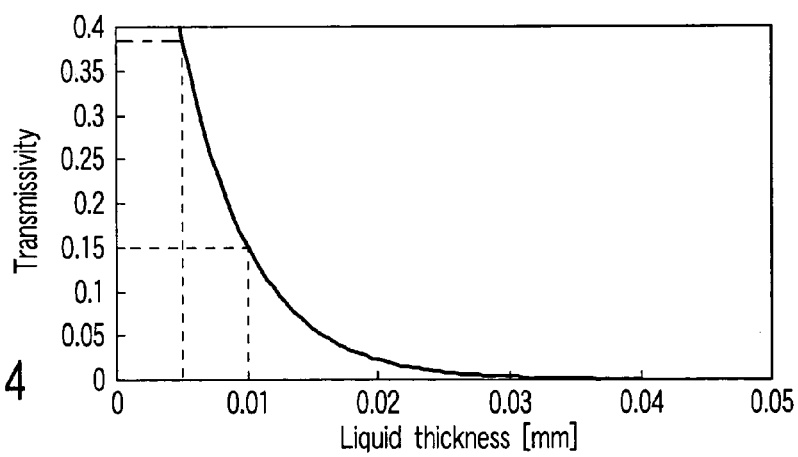
FIG. 14 is a diagram showing the relation between a liquid thickness and permeability of water in light of 172 nm.

Permeability of light to water varies significantly depending on the thickness of water. It is hence necessary to control the interval between the light emitting section and the wafer precisely. FIG. 14 shows the relation between the liquid thickness of water and the permeability in light of 172 nm. It is known from this relation that the liquid thickness must be controlled in the order of um units.

If the permeability of the liquid between the quartz glass 73 and the surface of the wafer 61 is less than 5%, the generation efficiency of the radical molecules and atoms decreases, and slimming process is difficult. Therefore, the gap is adjusted by the gap measuring mechanism 82 such that the permeability of the liquid between the quartz glass 73 and the surface of the wafer 61 is 5% or more.

(Step S205)

After the slimming process, pure water is supplied again while rotating the wafer 61, and the wafer 61 is cleaned.

(Step S206)

The wafer 61 is dried and processed. In drying process, without spin drying, the wafer 61 on which the liquid film of water is formed is conveyed to the substrate-processing apparatus shown in FIG. 2.

After conveying to the processing container 21, the valve 33 is opened, the temperature regulator 31 and high pressure pump 32 are operated, and carbon dioxide in a supercritical state is introduced into the processing container 21 at predetermined temperature and pressure. Further, by the temperature controller 24 of the processing container 21, the temperature in the processing container 21 is controlled to a predetermined temperature. While supplying the carbon dioxide in the supercritical state continuously into the processing container 21, with the valve 25 opened, the carbon dioxide in supercritical state containing water is discharged. After the water on the wafer 61 is discharged completely, the valve 33 is closed, the temperature controller 31 and high pressure pump 32 are stopped, and the processing container 21 is evacuated to dry the wafer 61.

The action and effect of the pattern forming method of the embodiment are explained below.

(Slimming Reaction: Step S204)

When light with wavelength of 250 nm or less is emitted to water, OH radicals or O radicals are generated. Both radicals are strong in acidity, and in particular OH radicals are very strong in acidity. Accordingly, the resist which is an organic matter is oxidized and decomposed by both radicals.

Therefore, light is emitted while the liquid film of water is formed on the wafer, and OH radicals and O radicals are generated. By the action between the OH radicals or O radicals with the resist, the resist is oxidized and decomposed, and the remaining dimension of the resist pattern decreases (slims). The reaction amount can be controlled by setting the light emission amount, emission time or liquid thickness of water to an appropriate value. Hence, the slimming amount can be controlled. Moreover, since uniform reaction of oxidation decomposition occurs slowly, line edge roughness of the resist pattern can be also decreased.

In this embodiment, water is used as the radical source, and OH radicals or O radicals can be produced also by hydrogen peroxide water. Hydrogen peroxide is more efficient because bimolecular OH radicals can be produced from one molecule. In the case of water, since the absorption is large at wavelength of 250 nm or less, OH radicals can be generated by emitting light of 250 nm or less. In the case of hydrogen peroxide water, the absorption is increased at 300 nm or less. Therefore, OH radicals are produced by emitting light including light with wavelength of 300 nm or less.

Still more, OH radicals, or O radicals can be produced by emitting light to water in which oxygen molecules or ozone molecules are dissolved. Slimming is caused by O radicals produced from dissolved oxygen or ozone, or OH radicals or O radicals produced from water. Absorption of water, and oxygen or ozone increases at 250 nm or less. Therefore, radicals are produced by emitting light including wavelength of 250 nm or less.

On the basis of results of experiment, the effects of this embodiment will be described below.

An antireflective film (film thickness: 50 nm) and a chemically amplifying resist (film thickness: 300 nm) are applied on a wafer. An ArF excimer laser (exposure wavelength $\lambda$: 193 nm) is emitted to the chemically amplifying resist by way of an exposure reticle, and a pattern formed on the reticle is exposed by reduction projection. The numerical aperture (NA) of the projection optical system is 0.6. The wafer is heated for 90 seconds at 120° C. It is developed for 60 seconds in an alkaline developing solution. Pure water is supplied, and the reaction is stopped, and the wafer is cleaned, and an independent pattern of 100 nm remains on the wafer. In this embodiment, the wafer was not dried by spinning after cleaning, but fluctuations of pattern dimension after development were 3 nm at 3σ same as in the first embodiment.

Slimming process was carried out in the condition of lamp output of 100 mW/cm$^2$, scanning speed of 2 mm/sec, and distance of quartz glass and wafer of 50 µm. In the drying process after slimming process, the wafer is dried for 30 seconds by the carbon dioxide in supercritical state of 35° C. and 10 MPa. After cleaning, the processing chamber was returned to 25° C. and atmospheric pressure as indicated by solid line in FIG. 4, and the wafer was dried.

As a result, the dimension of the independent residual pattern was 50 nm (resist film thickness: 275 nm). Fluctuations of pattern dimension were measured, and 3.5 nm was obtained at 3σ. Neither resist residue nor pattern tilting was observed. When 24 wafers were processed continuously, fluctuations among wafers were 3 nm at 3σ, and a high uniformity was obtained. In the conventional dry process, fluctuations among wafers were 4 nm at 3σ. Line edge roughness was half of the conventional dry process, thus favorable results were obtained.

By slimming using water activated by irradiation of light, slimming of pattern dimension is possible at excellent dimensional controllability both within the plane and among the wafers. By cleaning subsequently with carbon dioxide in the supercritical state, resist residue can be decreased. By drying from a state of introduction of carbon dioxide in the supercritical state, a resist pattern of a high aspect ratio could be formed.

In this embodiment, after slimming, cleaning and drying are executed by carbon dioxide in the supercritical state, but if there is no problem of pattern tilting, cleaning in liquid water and spin drying may be carried out. Or if there is no problem of resist residue, the pressure and temperature may be varied to change from supercritical water to a gaseous state of water when drying.

Other embodiments of the invention will be explained below.

In the embodiment, the light emitting section as shown in FIG. 6 is used, but it may be realized also as shown in FIGS. 15 to 22.

Figure 15:
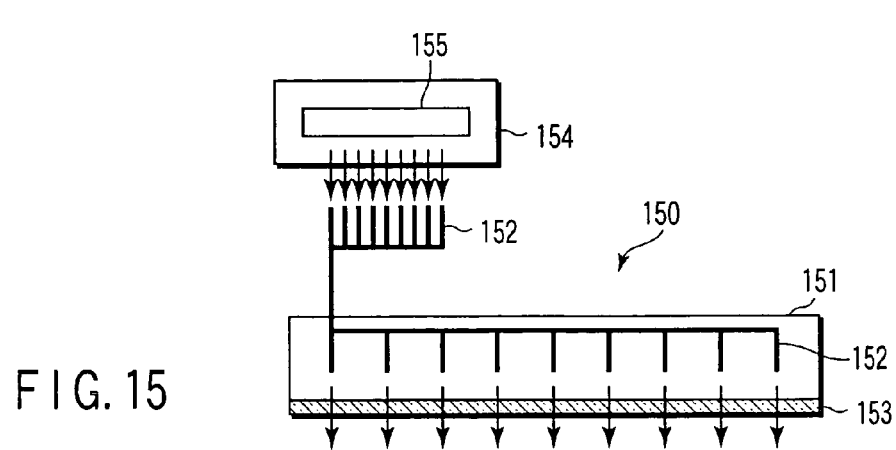
FIG. 15 is a diagram showing a schematic configuration of the light emitting section.

Further, the illumination source is not limited to the plurality of lamps. For example, a light emitting section 150 as shown in FIG. 15 may be used. In this light emitting section 150, one end of each of a plurality of optical fibers 152 is arranged to be opposite to the wafer. The other end of each optical fiber 152 is disposed in a lamp house 154. Light from a lamp 155 disposed in the lamp house 154 is emitted to the other ends of the optical fibers. The light of the lamp (light source) 155 is emitted to the wafer from one end of each optical fiber 152. By separating the lamp 155 and the light emitting section 150 from each other, the weight of the light emitting section 150 is reduced. As a result, it is easier to control the motion of the light emitting section 150, and the distance between the light emitting section 150 and the wafer.

Figure 16:
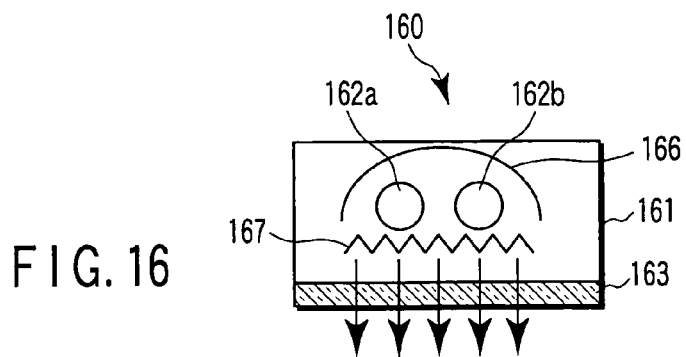
FIG. 16 is a diagram showing a schematic configuration of the light emitting section.

Alternatively, a light emitting section may be composed of a plurality of lamps disposed along the scanning direction. FIG. 16 shows a light emitting section 160 having two lamps 162a, 162b arranged along the scanning direction. When applying the same amount of illumination scanning of this light emitting section 160 and the light emitting section 70 shown in FIGS. 7A and 7B, the moving speed of the light emitting section 160 is two times the moving speed of the light emitting section 70. Therefore, by using the light emitting section 160, the processing time is shorter as compared with the case of using the light emitting section 70.

Figure 17A:
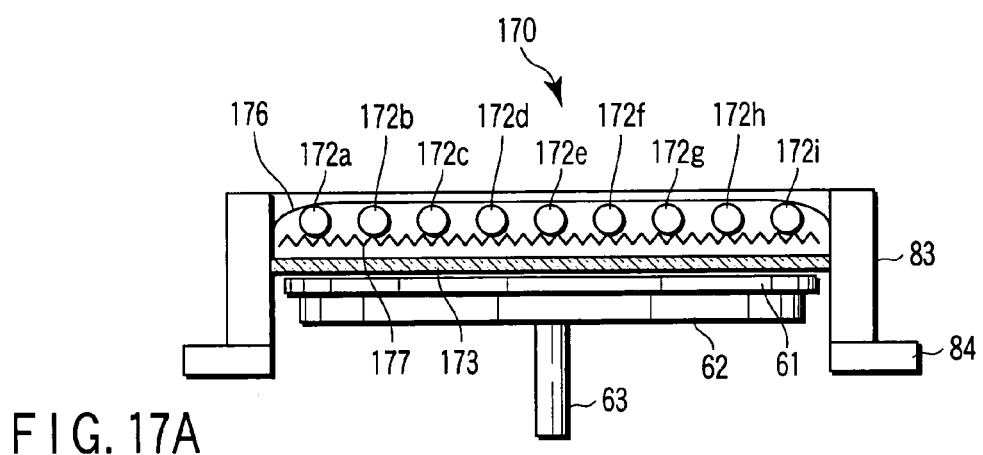
FIGS. 17A and 17B are diagrams showing a schematic configuration of the light emitting section.
Figure 17B:
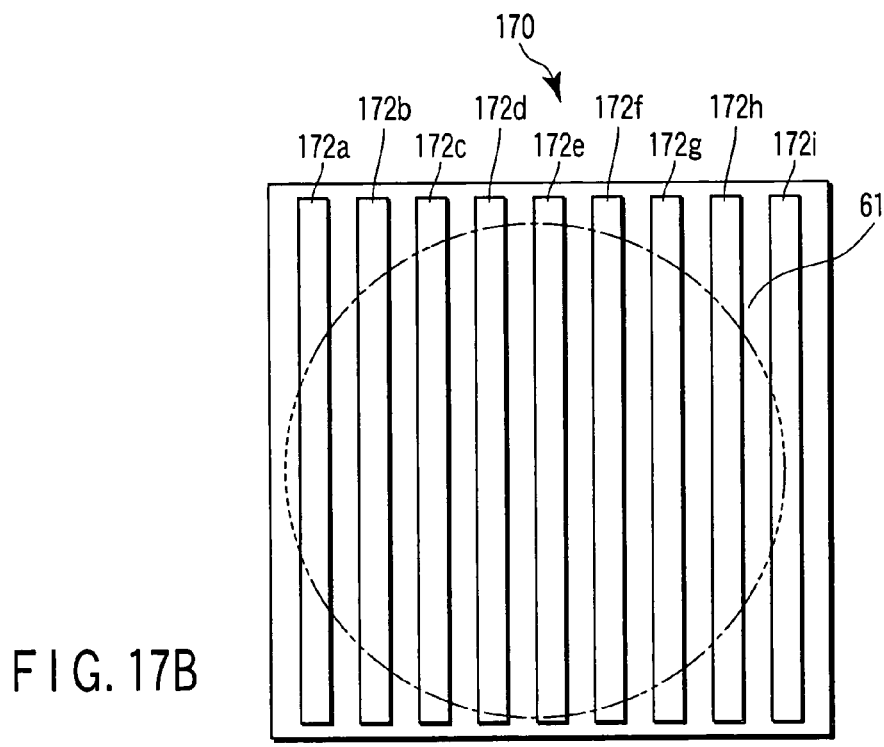

When uniformity of the illumination can be assured in a wide area, as shown in FIGS. 17A and 17B, it is also possible to use a light emitting section 170 having a larger illumination region than the wafer 61. FIG. 17A is a sectional view of the light emitting section, and FIG. 17B is a plan view of the light emitting section. In a lamp house of the light emitting section 170, lamps 172a to 172i are arranged. A reflector 176 is disposed at the upper side of the lamps 172a to 172i. A diffusion plate 177 is disposed between the lamps 172a to 172i and a quartz glass 173. When illuminating by this light emitting section, it is not required to move. Hence, the processing time can be substantially shortened.

Instead of scanning the light emitting section on the wafer on which a liquid film of pure water is formed, the light emitting section may be scanned while forming a liquid film of pure water on the wafer by scanning the liquid supply nozzle for supplying pure water on the wafer.

When slimming reaction occurs by OH radicals and the like, the resist which is an organic matter is decomposed, and water and carbon dioxide or other gasses are generated. As a gas is generated, the gas gets into the space between the plate member and the wafer, and the light intensity on the wafer varies, thus the amount of generated radicals varies significantly. However, the generated gas can be eliminated by supplying liquid while emitting light.

Figure 18:
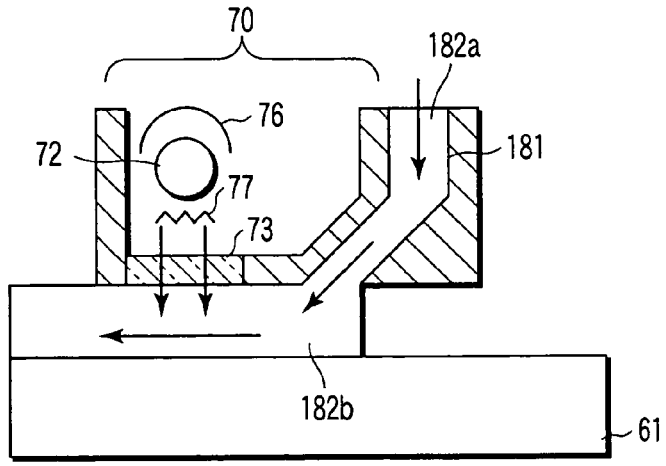
FIG. 18 is a diagram showing a schematic configuration of the light emitting section.

As shown in FIG. 18, the light emitting section 79 and a liquid supply nozzle 181 for supplying pure water onto the wafer are preferred to be integrated in one body. By an integral structure, the motion and gap adjustment of the liquid supply nozzle 181 and light emitting section 70 can be executed by one moving mechanism and gap adjusting mechanism. A liquid 182a in the nozzle 181 is supplied onto the wafer 61. Light from the lamp 72 is emitted to a liquid 132b supplied on the wafer 61.

When the liquid 132b on the wafer 61 is 0.5 µm or thicker, it is hard to remove the gas. Therefore, the light emitting section holding mechanism is preferred to have an interval of 0.5 mm or less between the top of the wafer and the quartz glass.

Figure 19:
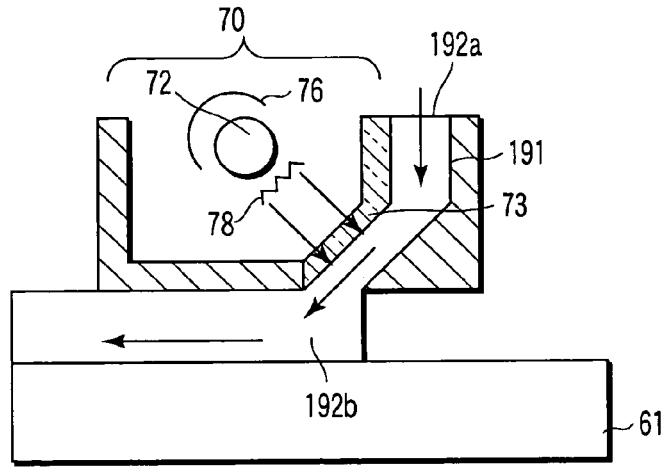
FIG. 19 is a diagram showing a schematic configuration of the light emitting section.

In the structure shown in FIG. 18, light from the lamp 72 illuminates the liquid 182b and wafer 61, and the resists react with both the light and the generated radicals. If desired to suppress the reaction between the light and the resist, the structure may be composed as shown in FIG. 19. As shown in FIG. 19, the quartz glass 73 is part of a liquid supply nozzle 191. The lamp 72 emits light to a liquid 192a in the nozzle 191. Radical atoms and molecules are generated in the nozzle 141. Generated radical atoms and molecules are supplied onto the wafer 61 by the flow of the liquid 192b. It is preferred to have a gap adjusting mechanism for adjusting the distance between the liquid supply nozzle 191 and the substrate as shown in FIG. 18. Generated radical molecules and atoms are immediately deactivated. To avoid deactivation of radical molecules and atoms, it is preferred to scan while narrowing the distance between the liquid supply nozzle 191 and the substrate. Further, by installing a gap measuring mechanism, it is preferred to adjust the distance by the gap adjusting mechanism while measuring the distance between the bottom of the liquid supply nozzle 191 and the substrate surface at the time of scanning.

Figure 20:
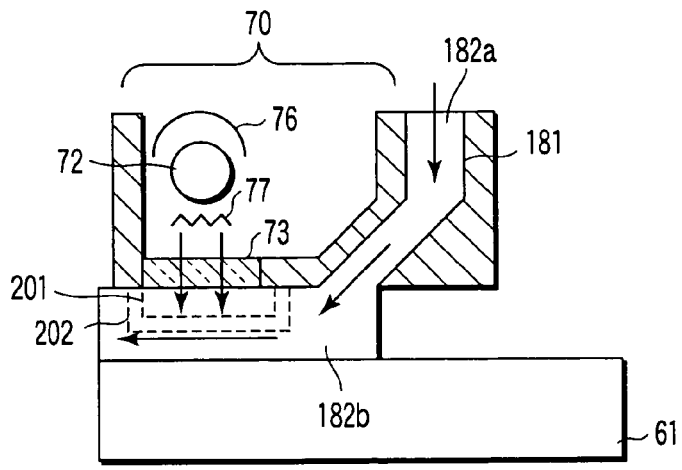
FIG. 20 is a diagram showing a schematic configuration of the light emitting section.

As shown in FIG. 20, in order that the light from the lamp 72 does not hit the wafer 61 directly, a double reticular structure 202 is provided between the quartz glass 73 and the wafer 61. The generated radical molecules and atoms pass through the reticular structures 201, 202, and are supplied onto the surface of the wafer 61.

Figure 21:
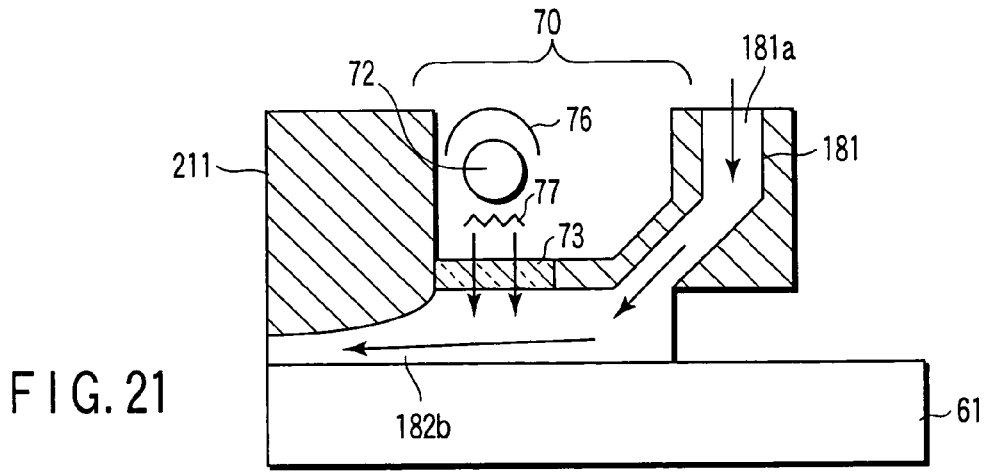
FIG. 21 is a diagram showing a schematic configuration of the light emitting section.

Further, as shown in FIG. 21, in another structure, the gap between the structure 211 at the downstream side of the quartz glass and the wafer 61 may be narrower than the gap between the quartz glass 73 and the wafer 61. In this structure, the radicals can be efficiently supplied to the surface of the wafer 61.

Together with the light emitting section and liquid supply nozzle, it may be also designed to scan the liquid supply nozzle for collecting the liquid on the wafer. By collecting the liquid on the wafer by the liquid recovery nozzle, the flow of the liquid may be made smooth. As a result, the gas generated by reaction can be removed efficiently.

Figure 22:
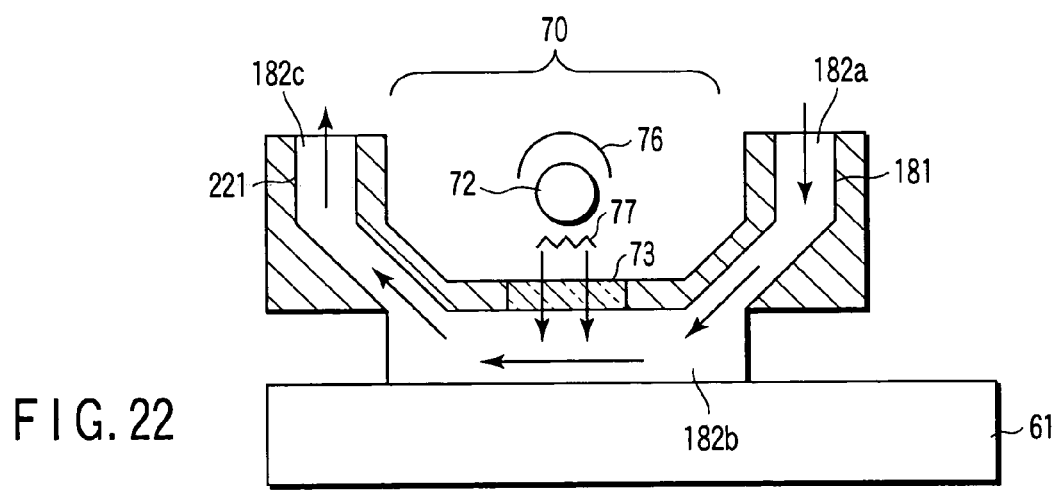
FIG. 22 is a diagram showing a schematic configuration of the light emitting section.

As shown in FIG. 22, the light emitting section 70, liquid supply nozzle 181, and liquid supply nozzle 221 are preferred to be integrated in one body. By integral structure, the move and gap adjustment of the liquid supply nozzle 181, light emitting section 70, and liquid suction nozzle 221 can be executed by one moving mechanism and gap adjusting mechanism.

In this embodiment, slimming is executed by moving the light emitting section only once at 2 mm/sec, but it is also effective to move plural times (for example, four times at 8 mm/sec). By moving quickly, the amount of generated gas decreases, and reaction fluctuations are smaller.

When moving plural times, it is effective to measure the pattern dimension before executing the slimming process. By measuring the pattern dimension, the reaction amount is known. Depending on the reaction amount, the number of times of scanning of the light emitting section, scanning speed, or illuminating condition (illumination amount and gap) may be varied to adjust to a desired reaction amount. By varying the number of times, scanning speed, or illuminating condition depending on the reaction amount, fluctuations of the reaction amount among wafers can be decreased.

Also, when the result of measurement of dimension reaches a desired amount, scanning of the light emitting section can be stopped to stop the slimming process. In this control method, too, fluctuations of the reaction amount among wafers can be decreased.

As the method of measuring pattern dimension, it is effective to employ a method of emitting light to the measuring region and measuring the dimensions from the intensity of its diffracted light (Jpn. Pat. Appln. KOKAI Publications No. 10-300428, and No. 2000-269120).

Figure 23:
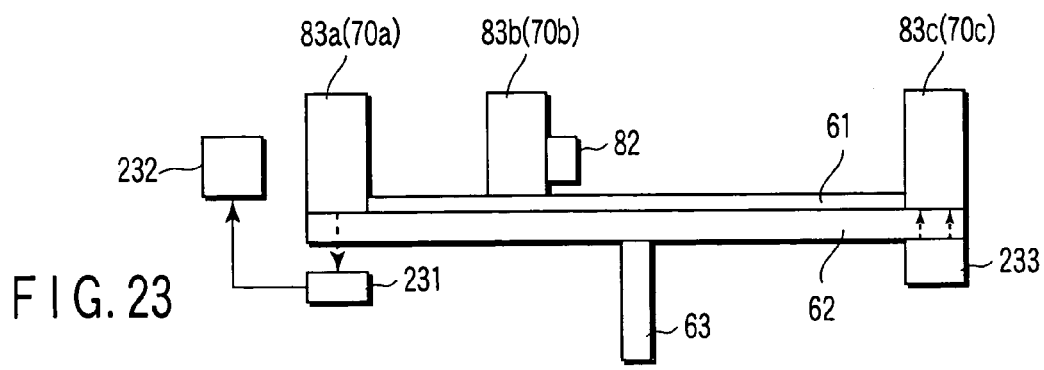
FIG. 23 is a diagram showing a schematic configuration of the substrate-processing apparatus.

It is also preferred to measure the illumination of the illuminating light from the light emitting section before the slimming process. As shown in FIG. 23, the illumination of the emitted light from the light emitting section 70a before the process is measured by an illumination measuring mechanism 231. When the lamp is divided, it is measured in each lamp. If the illumination varies in each lamp, it is controlled uniformly by a feedback mechanism 232.

Moreover, comparing the measured illumination and the predetermined reference value, the moving speed of the light emitting section 70, and the gap between the light emitting section and the wafer are controlled. As the reference value, the illumination of the previous process may be set. By this control, if the illumination varies with the time due to lamp deterioration or the like, a fixed illumination amount is given.

If the illumination is higher than the reference, the feedback mechanism 232 accelerates the moving speed of the light emitting section 70 or widens the gap. If the illumination is lower than the reference, it slows down the moving speed of the light emitting section 70 or narrows the gap.

As shown in FIG. 23, it is also preferred to clean the quartz glass of the light emitting section 70 by a cleaner 233 after the process. The quartz glass after the process is cleaned by a cleansing solution. In the case of organic matter, it can be cleaned by light of 172 nm, and cleaning effect is obtained only by illuminating the lamp.

Third Embodiment

FIG. 24 is a flowchart showing a processing procedure of a pattern forming method according to a third embodiment of the invention.

(Step S301)

An antireflective film and a chemically amplifying resist are applied on a semiconductor wafer. A desired pattern is exposed by reduction projection on the chemically amplifying resist by way of an exposure reticle by using an ArF excimer laser. The wafer is heated and conveyed to the top of a substrate holding section by means of a conveying robot (not shown), and sucked and fixed to the substrate holding section (not shown).

(Step S302)

A liquid film of pure water is formed on the resist surface, and using O radicals and/or OH radicals generated by emitting pure water to the liquid film, the resist surface is reformed.

Same as in the slimming process in the second embodiment (step S204), after forming the liquid film of pure water on the wafer, the light emitting section is operated to scan with the light being lit. In this embodiment, however, since the object is to reform the surface of the resist film, the amount of light emitted to the pure water is smaller than in the second embodiment. After the reforming process, pure water is supplied again while rotating the wafer, and the wafer is cleaned, and the wafer is rotated at high speed to be dried.

(Step S303: First Developing Process)

Next, same as in the second embodiment, a developing solution is supplied onto the wafer, and an exposed portion (unexposed portion) of the resist film is selectively removed in the developing process, and the resist pattern is formed.

(Step S304)

In about 5 seconds after supplying the developing solution to the wafer principal plane, ozone water (acidic liquid) is discharged from the rinsing solution discharge nozzle, and the wafer is rotated at the same time for 10 seconds, and the surface layer of the resist pattern on the wafer is reformed.

The wafer is rotated at high speed and the wafer is dried. In this embodiment, ozone water is used as acidic liquid. As liquids having similar oxidizing action, oxygen water, hydrogen peroxide water or the like may be used.

(Step S305: Second Developing Process)

Same as in the first developing process, the developing solution for processing the resist film on the wafer is supplied on the wafer, and a second developing process is carried out.

(Step S306)

In about 25 seconds after supplying the developing solution on the wafer principal plane, pure water is discharged from the rinsing solution discharge nozzle, and the wafer is rotated at 500 rpm at the same time, and is cleaned.

(Step S307)

In succession, the wafer is rotated at high speed and the wafer is dried. As a result, the developing process is over, and the wafer is collected by a conveying robot.

The action and effect of the pattern forming method described in the embodiment are explained below.

(Pretreatment: Step S302)

A developing process by a conventional developing method is schematically shown in FIG. 25. Herein, suppose the resist film is positive type.

Figure 25A:
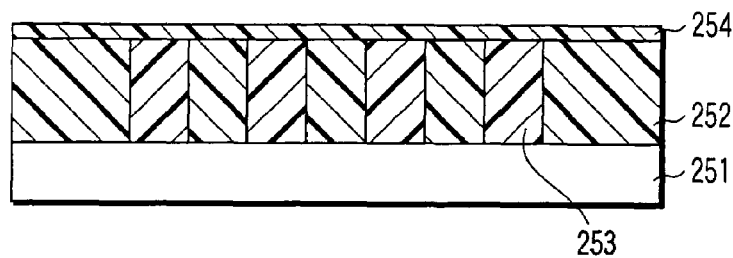
FIGS. 25A and 25B are schematic diagrams of a developing process in a conventional developing method.

As shown in FIG. 25A, of an exposed portion 253 and an unexposed portion 252 of an exposed and baked resist film on a wafer 251 by developing process, the exposed portion 253 is selectively removed, and thereby the resist pattern is formed.

Figure 25B:
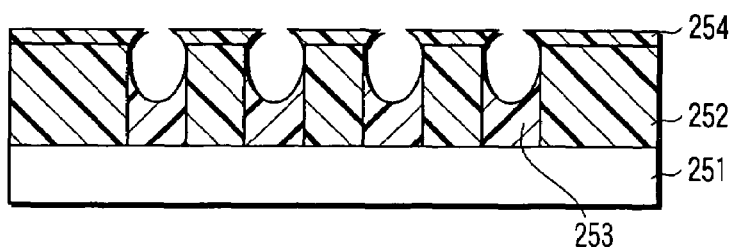

Generally, in the chemically amplifying photosensitive resist, to retain the rectangular pattern shape, the surface layer of the resist is hardly dissolved in an alkaline developing solution relatively, and formed as an insolvable layer 254. Therefore, in the first half of the developing process, the developing solution hardly permeates into patterns as shown in FIG. 25B.

Referring next to FIGS. 26A and 26B, the action and effect of pretreatment in the embodiment are explained. In the meantime, as in this embodiment, when treated by an oxidizing liquid before the developing process, an oxide layer 261 is formed on the surface layer of the resist as shown in FIG. 26A. By developing while the oxide layer 261 is formed, as shown in FIG. 26B, the developing solution easily permeates into the patterns. As a result, the developing speed is faster than before, and finer patterns can be formed.

(Surface Layer Reforming Process: S304)

In the pattern forming method of this embodiment, between the first developing process (S303) and the second developing process (S305), the surface layer is reformed by oxidizing liquid such as ozone water (S304). The action and effect of the reforming process are explained by referring to FIGS. 27A to 27C.

Figure 27A:
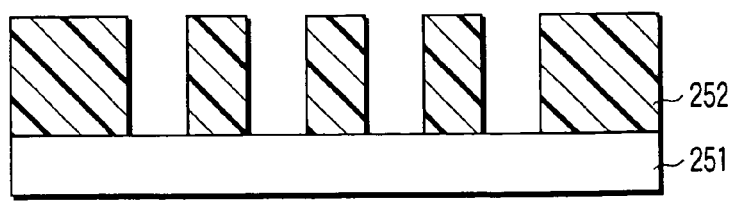
FIGS. 27A to 27C are explanatory diagrams of the action and effect of reforming process according to the third embodiment.
Figure 27B:
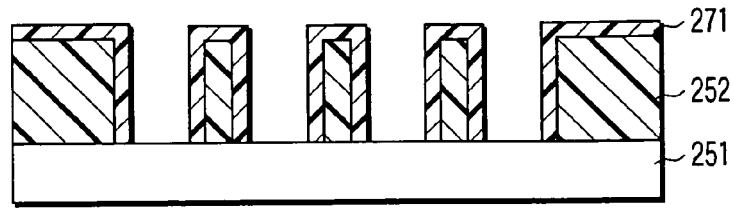
Figure 27C:
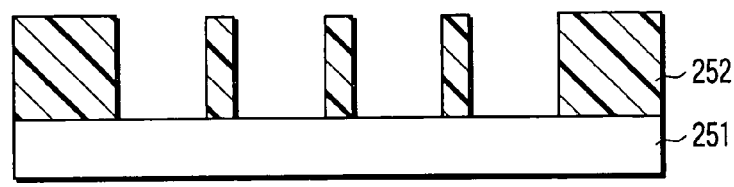

At the end of the first developing process, as shown in FIG. 27A, the exposed portion 253 is selectively removed by the developing solution, and the unexposed portion 252 is left over to form a resist pattern. Later, by reforming the surface by an oxidizing liquid, an oxide layer 271 is formed on the surface layer of the pattern as shown in FIG. 27B, and it is more likely to be dissolved in the developing solution. By developing again after oxidation process of the pattern surface layer, the oxide layer 271 is removed as shown in FIG. 27C, and a finer pattern can be formed.

On the basis of results of experiment, the effects of the pretreatment and surface layer reformation will be explained.

An antireflective film (film thickness: 50 nm) and a chemically amplifying resist (film thickness: 300 nm) are applied on a wafer. By emitting an ArF excimer laser (exposure wavelength λ: 248 nm) to the chemically amplifying resist through an exposure reticle including an isolated residual pattern of 150 nm (converted value on wafer by mask design), the pattern formed on the reticle is exposed by reduction projection. The numerical aperture (NA) of the projection optical system is 0.6. Heat treatment is followed by developing process.

First, effects by pretreatment are explained. A reference sample was prepared by developing once without pretreatment, and the exposure amount was set such that the finishing dimension at this time was 130 nm. Another sample was prepared by pretreating and developing once. To confirm the effect of pretreatment, the condition other than the pretreatment was same as in the reference sample. The condition of pretreatment was the lamp output of 100 mW/cm$^2$, the scanning speed of 4 mm/sec, and the distance between the quartz glass and the wafer of 50 μm. The pattern finishing dimension of the sample with pretreatment was 110 nm, and the pattern dimension was finer than in the reference sample.

Next, effects by surface reforming process are explained. A reference sample was prepared by developing once without pretreatment, and the exposure amount was set such that the finishing dimension at this time was 130 nm. Anther sample was prepared by pretreating and developing once. Samples for confirming the effect of surface layer reforming process were prepared. The sample preparing conditions and finishing dimension are shown in Table 1.

TABLE 1

| | Pre-treatment | First developing process | Surface layer reformation | Second developing process | Dimension |
|---|---|---|---|---|---|
| Reference | No | Yes | No | No | 130 nm |
| Sample A | No | Yes | Ozone water 1 ppm | Yes | 121 nm |
| Sample B | No | Yes | Ozone water 5 ppm | Yes | 113 nm |
| Sample C | No | Yes | Ozone water 10 ppm | Yes | 105 nm |

As shown in Table 1, by reforming the surface layer, the sample finishing dimension is finer than in the reference sample. The dimension is finer as the ozone water concentration is higher.

In a practical application range of this embodiment, supposing the pattern dimension after the process of lithography (130 nm in this embodiment) to be L [nm], the exposure wavelength to be $\lambda$ [nm], and the numerical aperture of the projection optical system to be NA, the value of N normalized by $\lambda$/NA is 1.2 or less (0.87 in this embodiment).

Other Embodiments

The first and second embodiments presented examples of processing the pattern in a finer dimension by oxidizing the resist pattern after developing process. The third embodiment presented an example of processing the pattern in a finer dimension by oxidizing the resist pattern before developing process, and an example of processing the pattern in a finer dimension by oxidizing and then developing the resist pattern after developing process.

The oxidizing process is a method of contacting the resist with supercritical water or subcritical water in the first embodiment, a method of emitting light to water to generate radicals to contact with the resist in the second embodiment, and a method of contacting the resist with the oxidizing liquid in the third embodiment. The sequence of these processes and combination of the oxidation processes can be selected as desired.

As the activated water used in slimming process and surface layer reforming process in the second and third embodiments, an oxidizing liquid can be used. Such oxidizing liquid is pure water in which ozone, oxygen or hydrogen peroxide is dissolved.

In the slimming process and surface layer reforming process, the surface of the resist pattern is oxidized, and an oxide film of 5 nm or more is formed. To form an oxide film of 5 nm or more, in the case of ozone water having 1 ppm of ozone dissolved in pure water, it is desired to contact with the resist pattern for 10 seconds or more. The thickness of the oxide film varies between when treated and when not treated with ozone water, by measuring the film thickness difference of the region of the undissolved resist (unexposed portion in the case of the positive resist) when developed after each process.

Comparing the oxidizing power of the three methods of oxidation shown in the embodiment, the method of contact of the oxidizing liquid with the resist is relatively weak in oxidizing power. The other two methods are strong in the oxidizing power, and are effective on any resist. The method of contact of the relatively weak oxidizing liquid with the resist is effective in an i-ray resist composed of a novolak resin oxidized by a relatively weak power or a KrF resist composed of polyhydroxy styrene resin, but is not effective enough in an ArF resist formed of an alicyclic resin (acrylic, coma or hybrid resin) which is not oxidized by weak power. A proper method of oxidation having an oxidizing power necessary for oxidation of a desired resist resin may be selected.

Fourth Embodiment

A method of manufacturing a semiconductor device, and a substrate-processing apparatus according to a fourth embodiment of the invention are described below while referring to FIGS. 28 and 29A to 29D. FIG. 28 is a flowchart showing the method of manufacturing a semiconductor device according to the fourth embodiment of the invention. FIGS. 29A to 29D are sectional views showing the method of manufacturing a semiconductor device according to the fourth embodiment of the invention.

Figure 29A:
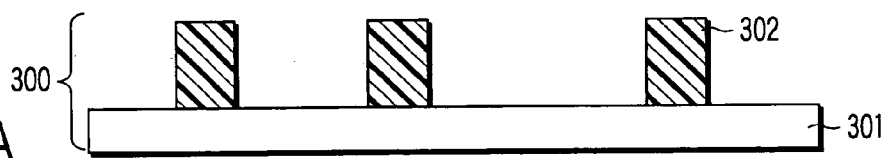
FIGS. 29A to 29D are sectional views showing a method of manufacturing a semiconductor device according to the fourth embodiment.

First, as shown in FIG. 29A, an isolated residual resist pattern (resin film pattern) 302 of 100 nm is formed on a substrate 301 to be treated (step S401). The substrate 301 is a wafer in the midst of manufacture of a semiconductor device. More specifically, by etching the substrate 301 using the resist pattern 302 to be processed as mask, a gate electrode pattern of an MOS transistor is formed.

A process of forming the resist pattern 302 is explained. An antireflective film (film thickness 50 nm) and a chemically amplifying resist (film thickness 300 nm) are applied on the substrate 301 to be processed, and an ArF excimer laser is emitted and a gate processing pattern is exposed by reduction projection by way of an exposure reticle. The substrate is heated for 90 seconds at 120° C., and an alkaline developing solution is supplied for 60 seconds to develop the resist film. After a predetermined period of time elapses, pure water is supplied, and the reaction is stopped and the substrate is cleaned.

The wafer 300 having the substrate 301 to be processed and resist pattern 302 is conveyed into a substrate-processing apparatus 400 shown in FIG. 30 (step S402). FIG. 30 is a diagram showing a configuration of the substrate-processing apparatus according to the fourth embodiment of the invention. As shown in FIG. 30, the substrate-processing apparatus 400 has a substrate holding section 402 for holding the substrate 301 to be processed in a chamber 401. The substrate holding section 402 has a cooling function using the Peltier element (or water cooling function) for adjusting the temperature of the wafer 300. A light emitting section 410 is provided. The light emitting section 410 emits light of 172 nm to be adsorbed by water to the principal plane of the wafer 300. The light emitting section 410 can scan on the principal plane of the wafer 300 by moving means 403.

The chamber 401 incorporates a cleaning solution supply section 404 for supplying a cleaning solution (pure water) to the substrate to be processed, opposite to the principal plane of the wafer 300. Also opposite to the principal plane of the wafer 300, there is a dryer 405 for drying the principal plane of the wafer 300. The cleaning solution supply section 404 and dryer 405 can scan on the principal plane of the wafer 300 by means of moving means 406.

In the chamber 401, a gas feeder 420 for introducing nitrogen (N2) gas or oxygen (O2) gas is connected to the chamber 401. The gas feeder 420 includes MFCs (mass flow controllers) 421a to 421c and a bubbler 422. An exhaust unit 430 for exhausting the chamber 401 is connected to the chamber by way of a piping. Further, an MFC controller 423 is provided for controlling the flow rate of each of the MFCs 421a to 421c.

The configuration of the light emitting section 410 is explained by referring to FIGS. 31A and 31B. FIGS. 31A and 31B are diagrams showing a configuration of the light emitting section of the substrate-processing apparatus shown in FIG. 30. FIG. 31A is a view from the scanning direction, and FIG. 31B is a sectional view from a direction orthogonal to the scanning direction.

As shown in FIGS. 31A and 31B, a plurality of lamps 412 are disposed in a lamp house 411 along the direction orthogonal to the scanning direction. The lamps 412 are excimer lamps for emitting light in wavelength of 172 nm. At the side of the lamp house 411 facing the wafer, a quartz glass (transparent plate) 413 is disposed. An electric power is applied to the lamps 412 from a power input section 415. The power input section 412 supplies an electric power independently to each lamp 412, and can adjust the illumination of each lamp 412.

The lamp house 411 incorporates a reflector 416 for emitting the light from the lamps 412 efficiently to the wafer side. A diffusion plate 417 is disposed between the lamps 412 and the quartz glass 413 in order to decrease unevenness of the illumination.

The lamp is composed of the plurality of lamps 412 in order to enhance the uniformity of the illumination by adjusting the input power to each lamp, and as long as the illumination is uniform, it is not required to use divided lamps.

The process by using the substrate-processing apparatus shown in FIG. 30 is explained. The wafer 300 is conveyed and held by the substrate holding means 402 of the apparatus 400 by a substrate conveying system from a carrier station (not shown). After putting the wafer 300 on the substrate holding means 402, the atmosphere in the chamber is replaced by the gas feeder 420 and exhaust unit 430. Herein, the MFC controller 423 controls the MFCs 421a, 421b, and replaces the chamber 401 with the atmosphere of nitrogen and oxygen. The oxygen concentration is adjusted to 1%.

Consequently, by hydrophilic treatment of the surface of the resist pattern 302, the contact angle of the resist pattern to water is increased (step S403). This hydrophilic treatment is intended to improve the contact angle because the contact angle of the resist pattern 302 to the pure water is 50 degrees and it is difficult to form an adsorption film of water in a later process in this state. This hydrophilic treatment is not needed if the resist pattern is already high in hydrophilic property.

The hydrophilic treatment is explained. In the mixed atmosphere of nitrogen and oxygen mentioned above, light of 172 nm is emitted to the entire surface of the substrate to be processed from the light emitting section 410. By emission of light of 172 nm, ozone is produced from oxygen. The produced ozone reacts with the resist pattern 302, and the surface of the resist pattern 302 is made hydrophilic. After hydrophilic treatment for a predetermined time, emission of light from the light emitting section 410 is stopped.

Figure 29B:
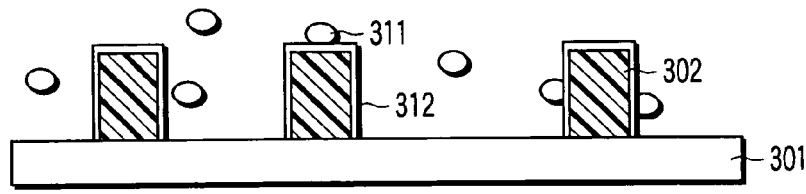

In succession, nitrogen gas with humidity of 80% is supplied from the gas feeder 420 into the chamber 401. Adjustment of humidity is explained. The humidity of the mixed gas mixing the nitrogen gas passing through the bubbler 422 filled with pure water and a pure nitrogen gas is measured by a hygrometer (not shown). Depending on the measured humidity, the MFC controller 423 controls the MFCs 421b, 421c, and varies the mixing ratio of two nitrogen gases. As shown in FIG. 29B, an adsorption film 312 of water is formed on the surface of the resist pattern 302 by steam 311 (step S404). The thickness of the water adsorption film 312 at this time was several um.

Figure 29C:
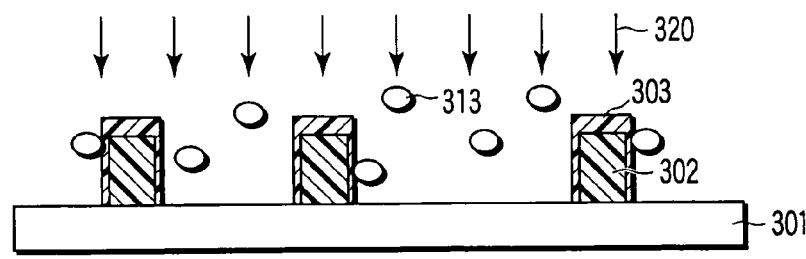

Next, as shown in FIG. 29C, with the adsorption film 312 formed on the surface of the resist pattern 302, light 320 of 172 nm is emitted from the light emitting section 410, and the resist pattern 302 is slimmed (step S405). FIG. 32 is a characteristic diagram showing the wavelength dependence of the absorption coefficient of water. As shown in FIG. 32, the water has a great absorption coefficient to the light of 172 nm. Hence, the emission of the light 320 of 172 nm, radical molecules/atoms 311 of OH radicals or O radicals are produced from the adsorption film 312 and steam 311 by light excitation. The radical molecules/atoms 313 and resist pattern 302 react with each other, a reaction product 303 is formed, and the resist pattern 302 is reduced in size.

Figure 33:
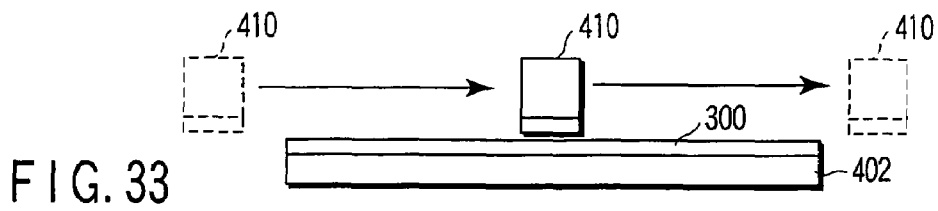
FIG. 33 is a diagram showing a moving mode of the emitting section of the substrate-processing apparatus at the time of slimming process.

The light 320 was emitted from the light emitting section 410 by scanning the light emitting section 410 from one end to the other end on the principal plane of the wafer 300 with the lamp 412 being lit as shown in FIG. 33. In this embodiment, the scanning speed of the light emitting section 410 was adjusted such that the illumination time of the light 320 (slimming process time) was 10 seconds.

In this embodiment, the output of the lamp 412 was 100 mW/cm$^2$, and the distance between the quartz glass 413 and the substrate was 20 mm. At this time, the substrate was cooled such that the wafer 300 was 50° C. or less by way of the substrate holding section 402. At the same time, the humidity of the atmosphere supplied between the quartz glass and the substrate to be processed was adjusted to be always 80%. The humidity control is intended to prevent drying of adsorbed water on the resist film surface, and to supply moisture to the resist film surface in slimming. The reaction product 303 is alcoholic (having an alcoholic OH radical), and is likely to lower the melting point to cause flowing phenomenon. To prevent flow of the reaction product 303, the wafer 303 is cooled by the substrate holding means 402.

Figure 29D:

After predetermined slimming process, as shown in FIG. 29D, the cleaning solution supply section 404 scans on the wafer 300, and pure water is supplied to clean the wafer 300 (step S406). Further, by scanning the dryer 405 on the wafer 300, water drops remaining on the surface of the wafer 300 are removed (adsorbed water is held on the resist film surface).

The slimming rate (the thinning rate of the resist pattern) obtained by this series of operation was 2 nm/s, and the slimming amount was 20 nm. By the series of processing, the resist pattern for gate processing which has been 100 nm immediately after development was reduced to 80 nm.

Further, repeating from step S404 to step S406 (10 seconds in step S405), the resist pattern 302 was reduced to 60 nm. The process from steps S404 to S407 was divided in two phases because the light of 172 nm used in illumination is attenuated within the reaction product 303 and reaction does not take place on the surface of the resist pattern 302. Also because of high reactivity of OH radicals, almost all radicals react completely on the surface of the resist pattern 302.

The device using the gate fabricated by processing such resist pattern 302 into a mask could be processed to a finer size than the gate dimensions used without this processing, and hence an excellent response was obtained.

In this embodiment, the resist pattern could be slimmed efficiently, and the device manufactured by employing this technique was proved to have an excellent response as compared with the one fabricated by using the prior art.

For irradiation with light to be absorbed by water in the embodiment, the excimer lamp light source for emitting light of 172 nm to the entire surface of the substrate was used, but it is not limited. A light source emitting in slit or spot may be used. It may be changed properly depending on the required processing uniformity or processing time. In any case, however, it is required to cool the substrate to be processed in the illumination region. Aside from the excimer lamp, low pressure mercury lamp or the like may be used as the light source.

The film to be processed (resist pattern) is not limited to the composition mentioned above. As the resist used in the embodiment, the chemically amplifying resist having reactivity to ArF was used, but not limited to this, same effects were obtained by using other alicyclic resins (acrylic, coma, hybrid resin). Still more, any other may be used as long as alcoholic OH radicals are produced by the addition reaction of OH radicals caused by ultraviolet ray irradiation. Same effects were also confirmed in the I-ray or G-ray resist having a novolak resin effective to the resin having an aromatic compound, the KrF resist composed of a resin having polyvinyl phenol skeleton, the resist for electron beam exposure, or resist for soft X-ray exposure (EUV). In the case of using the resin having an aromatic compound, a higher slimming rate was obtained by using alkaline water, such as TMAH (tetramethyl ammonium oxide) solution or KOH solution.

In drying, further, by using carbon dioxide water in a supercritical state, favorable processing without pattern tilting is possible. The substrate to be processed is transferred into a high pressure chamber, and the pure water on the principal plane of the substrate to be processed after slimming process is first replaced with alcohol capable of dissolving carbon dioxide. Further, this alcohol is replaced with liquid $CO_2$. Drying from the liquid $CO_2$ state is executed at 35° C., 10 MPa, after changing the $CO_2$ state in the supercritical state, and the pressure in the chamber is gradually lowered and the $CO_2$ is vaporized and removed.

In this embodiment, if cleaned by pure water, hydrogen peroxide water or alcohol after slimming process, marked undulations may be formed on the resist pattern surface due to condensation of swollen layer caused at the time of wet processing. In such a case, it is effective to emit light of 172 nm to the resist pattern surface in the oxygen or ozone atmosphere after cleaning. The swollen layer is, so to speak, a intermediate reaction product, and by such processing, it can be selectively peeled off. As a result, a smooth pattern surface without undulation can be formed, and the reliability of the device can be further enhanced.

The action of the embodiment is described below. When water is irradiated with light with wavelength of 200 nm or less, OH radicals or O radicals are produced. These OH radicals and O radicals are very strong in acidity, and oxidize and decompose the resist which is an organic matter. Therefore, by emitting light with the liquid film of water formed on the substrate to be processed, and acting with OH radicals and O radicals, the resist is decomposed, and the residual dimension of the resist pattern decreases (slims). Moreover, by setting the irradiation amount, irradiation time, and liquid thickness of water at proper values, the reaction amount can be controlled, and hence the slimming amount can be controlled. Still more, a uniform oxidation and decomposition reaction occurs slowly, line edge roughness can be also decreased. In the embodiment, water is used as a radical source, and same effects are obtained by using hydrogen peroxide water. When using hydrogen peroxide water, it is preferred to emit light of wavelength of 300 nm or less.

Instead of water as a radical source, it is also effective to use oxygen water or ozone water.

Figure 34:
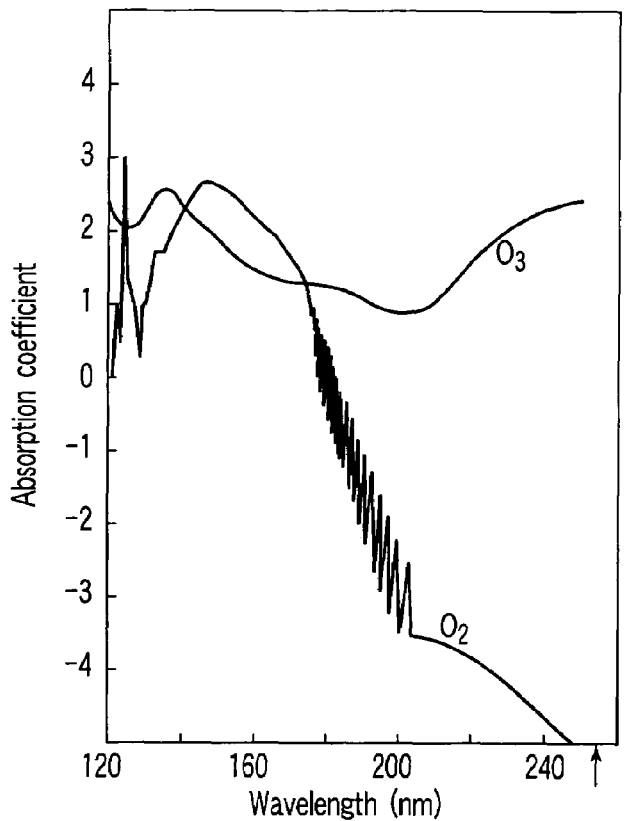
FIG. 34 is a characteristic diagram showing the wavelength dependence of oxygen and ozone.

In the embodiment, light of 172 nm is used for hydrophilic treatment of the resist pattern surface, but it is not limited. Similar hydrophilic effects are obtained by supplying ozone water having ozone ($O_3$) dissolved in pure water onto the resist film surface. Since the ozone water also has a function of removing particles after development, the ozone water may be used in the rinsing process of development to obtain hydrophilic effect beforehand. Alternatively, by placing the substrate to be treated in the atmosphere including oxygen or ozone, O radicals are produced by light excitation, and thereby slimming process may be executed. FIG. 34 shows the wavelength dependence of absorption coefficient of oxygen and ozone. In the case of ozone water, from the characteristic diagrams in FIGS. 32 and 34, it is preferred to execute slimming process by selecting the wavelength of high absorption coefficient of both ozone and water. In the atmosphere containing ozone or oxygen, the slimming process is executed by selecting the wavelength of higher absorption coefficient from the characteristic diagram shown in FIG. 34.

In this embodiment, as the pattern to be slimmed, an example of the resist pattern is shown, but the application of the invention is not limited to this example alone.

The pattern is not limited as long as the pattern size is reduced by the water activated by light irradiation. It may be applied in a slimming process for a resin-based insulating film. It may be also applied in oxidation and reforming process for a resin film surface such as an insulating film. The silicon nitride film pattern is also reduced in size and hence the pattern can be formed by this method. Of course, it can be applied when forming an oxide film on the surface.

It can be further applied in the case of removal (regeneration) of the resist film when a defect occurs in the resist pattern. In this case, the treating time should be adjusted such that the resist pattern disappears in the width direction. In the presence of a large pattern, the same process may be repeated by removing the reaction product.

Fifth Embodiment

Figure 35:
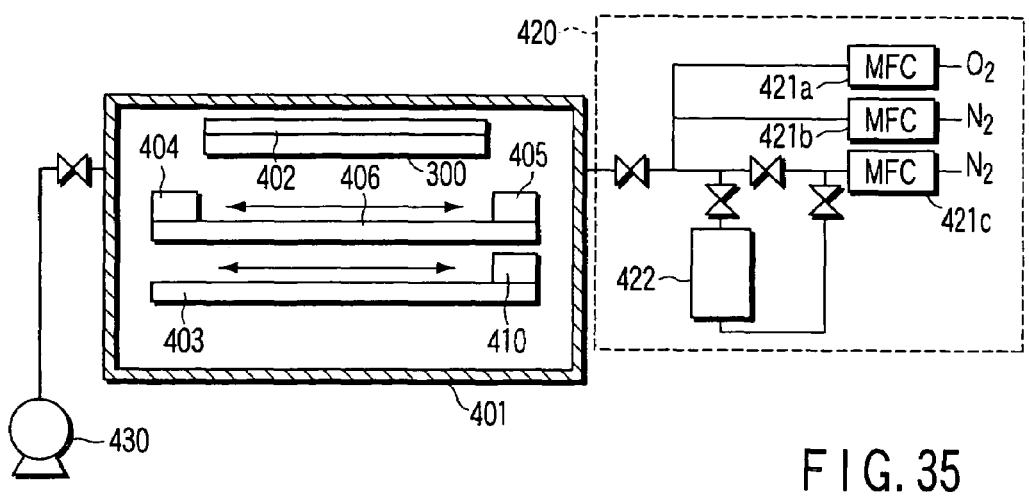
FIG. 35 is a diagram showing a schematic structure of a substrate-processing apparatus according to a fifth embodiment of the invention.

In this embodiment, slimming process is executed by using a different substrate-processing apparatus from the one in the fourth embodiment. FIG. 35 is a diagram showing a schematic configuration of a substrate-processing apparatus according to a fifth embodiment of the invention. In FIG. 35, same parts as in the apparatus shown in FIG. 30 are identified with same reference numerals, and detailed description is omitted.

As shown in FIG. 35, the wafer 300 is held at the lower side of the substrate holding means 402, and the principal plane of the wafer 300 (the resist pattern forming side) is directed downward. The quartz glass 413 of the light emitting section 410 is directed upward. The lamp 412 is an excimer lamp for emitting light of 222 nm to be absorbed by water. The bubbler 422 is filled with hydrogen peroxide water at concentration of 5%, instead of pure water.

Figure 36A:
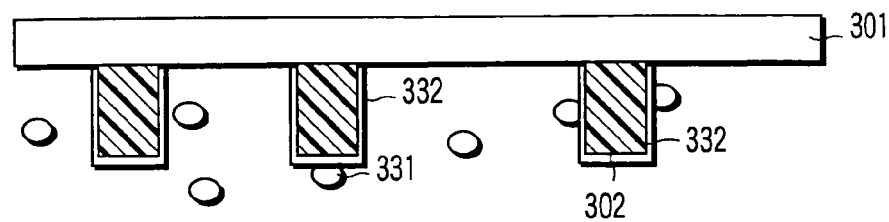
FIGS. 36A to 36C are sectional views showing a method of manufacturing a semiconductor device according to the fifth embodiment.
Figure 36B:
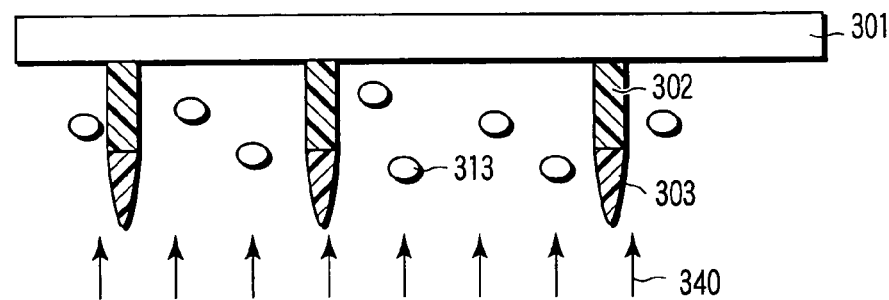
Figure 36C:
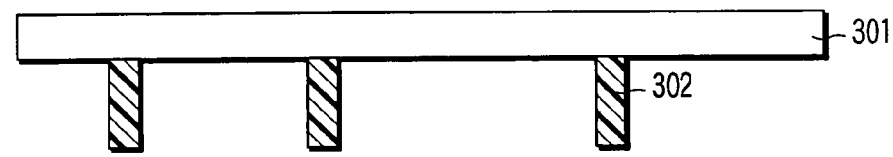

Referring now to FIGS. 35 and 36A to 36C, the substrate processing in the embodiment is explained. FIGS. 36A to 36C are sectional views showing a substrate processing method according to the fifth embodiment of the invention.

First, same as in the fourth embodiment, the resist pattern 302 shown in FIG. 28A is formed (step S401). It is then conveyed into the substrate-processing apparatus shown in FIG. 35 (step S402). The principal plane of the wafer 300 is directed downward.

A mixed gas of vapor of hydrogen peroxide water nitrogen gas is supplied into the chamber 401 from the gas feeder 420. The humidity of the mixed gas is set at 80%. As shown in FIG. 36A, by vapor 331 of the hydrogen peroxide water, an adsorption film 332 of hydrogen peroxide water is formed on the surface of the resist pattern 302 (step S404).

Figure 37:
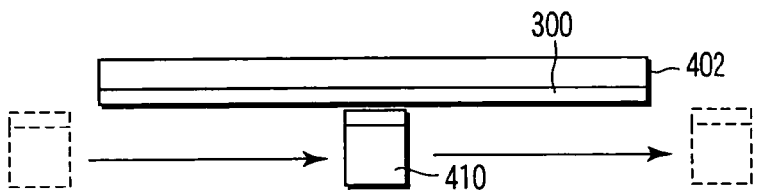
FIG. 37 is a diagram showing a moving mode of emitting section of the substrate-processing apparatus at the time of slimming process.
Figure 38:
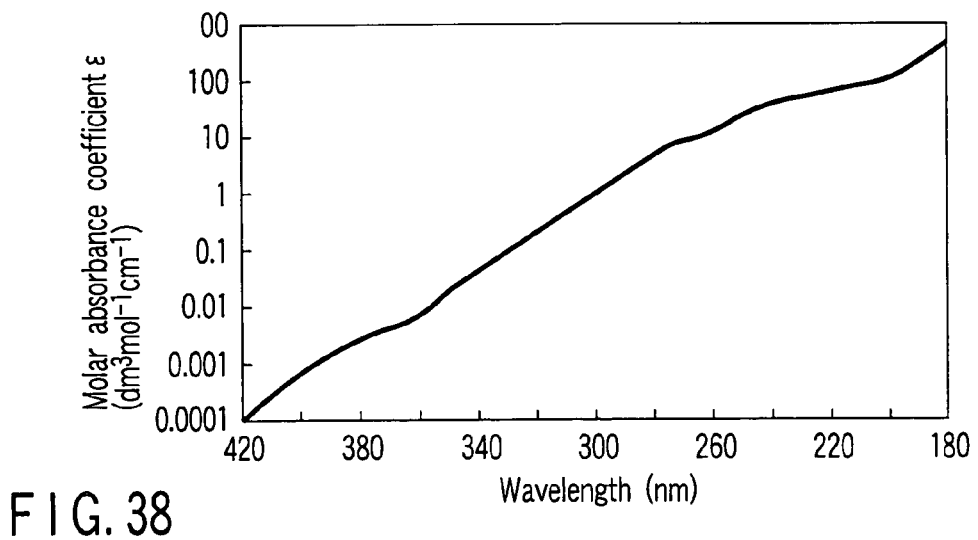
FIG. 38 is a characteristic diagram showing the wavelength dependence of absorption coefficient of hydrogen peroxide water.

In this state, as shown in FIG. 37, while emitting light of 222 nm to the principal plane of the wafer 300, the light emitting section 410 is scanned on the principal plane of the wafer 300. The output of the lamp 412 was set at 50 mW/cm$^2$, the scanning speed of the light emitting section 410 at 2 mm/sec, and the distance between the quartz glass 413 and the wafer 300 at 1 mm. At the scanning speed of 2 mm/sec, the shape of the light emitted from the light emitting section 410 on the principal plane of the wafer 300 is 40 mm in the scanning direction. Therefore, the duration of the light emitted to the resist pattern (slimming process time) is 20 seconds. By the substrate holding section 402, the temperature of the wafer 300 was adjusted to 100° C. The wavelength dependence of the absorption coefficient of hydrogen peroxide water is shown in FIG. 38. As shown in FIG. 38, the absorption coefficient of hydrogen peroxide water has a large absorption coefficient at wavelength of 222 nm. Hence, by irradiation with light of 222 nm, OH radicals and O radicals are produced from hydrogen peroxide water by light excitation.

As shown in FIG. 36B, irradiation with light 340 generates active radical molecules/atoms 313 from the vapor 331 and adsorption film 332. By reaction of the radical molecules/atoms 313 with the surface of the resist pattern 302, the width of the resist pattern 302 thins out. By reaction, the reaction product 303 is formed.

The reaction product 303 is fluidized because the temperature of the wafer 300 is set at 100° C. The fluidized reaction product 303 moves to the leading end of the pattern 302. The reaction product is small in surface tension, and is not aggregated even if moving to the leading end and is formed like an icicle. Since the leading end of the resist pattern 302 is protected by the icicle-like reaction product 303, etching in the thickness direction is suppressed.

After slimming, by washing the surface of the resist pattern 302 with water, the icicle-like reaction product is dissolved, and a desired pattern is obtained as shown in FIG. 36C.

At this time, the slimming rate (the resist pattern thinning speed) was 3 nm/s, and the slimming amount was 60 nm. By this series of processing, the resist pattern for gate processing which has been 100 nm immediately after development was reduced to 40 nm.

The resist pattern obtained by this method has been anisotropically etched in the width direction at the time of slimming, and a sufficient film thickness is assured for withstanding the processing in the later etching process.

The device using the gate fabricated by processing such resist pattern into a mask could be processed to a finer size than the gate dimensions used without this processing, and hence an excellent response was obtained.

In this embodiment, the resist pattern could be slimmed efficiently, and the device manufactured by employing this technique was proved to have an excellent response as compared with the one fabricated by using the prior art.

As the resist used in the embodiment, the chemically amplifying resist having reactivity to ArF was used, but not limited to this, same effects were obtained by using other alicyclic resins (acrylic, coma, hybrid resin). Still more, any other may be used as long as alcoholic OH radicals are produced by the addition reaction of OH radicals caused by ultraviolet ray irradiation. Same effects were also confirmed in the I-ray or G-ray resist having a novolak rein effective to the resin having an aromatic compound, the KrF resist composed of a resin having polyvinyl phenol skeleton, the resist for electron beam exposure, or resist for soft X-ray exposure (EUV). In the case of using the resin having an aromatic compound, a higher slimming rate was obtained by using alkaline water, such as TMAH (tetramethyl ammonium oxide) solution or KOH solution.

In the embodiment, as the substance for producing OH radicals, hydrogen peroxide water is used, but not limited to this, same effects are obtained by using pure water and irradiating with light of 200 nm or less. The concentration is not predetermined, and slimming effects were confirmed in a concentration range of 1 ppm to 30%. The adjustment of the substrate temperature is desired to be in a range of 30 to 50° C. when using hydrogen peroxide water, or in a range of 30 to 90° C. approximately when using pure water.

In the case of this embodiment, after slimming, by heating the substrate to be processed to a temperature at which the resist pattern is not fluidized, the reaction product can be vaporized and removed. Even in the midst of slimming, by heating the feeding gas, the temperature of the resist surface is raised to form an icicle, and it may be partly vaporized.

It is also possible to remove by washing in water. When drying after washing in water, by using carbon dioxide water in supercritical state, favorable processing without pattern tilting is possible. The substrate to be processed is transferred into a high pressure chamber, and the pure water on the principal plane of the substrate to be processed after slimming process is first replaced with alcohol capable of dissolving carbon dioxide. Further, this alcohol is replaced with liquid $CO_2$. Drying from the liquid $CO_2$ state is executed at 35° C., 10 MPa, after changing the $CO_2$ state in the supercritical state, and the pressure in the chamber is gradually lowered and the $CO_2$ is vaporized and removed.

In this embodiment, if cleaned by pure water, hydrogen peroxide water or alcohol after slimming process, marked undulations may be formed on the resist pattern surface due to condensation of a swollen layer caused at the time of wet processing. In such a case, it is effective to emit finally light of 172 nm to the resist pattern surface in the oxygen or ozone atmosphere. The swollen layer is, so to speak, a reaction intermediate product, and by such processing, it can be selectively peeled off. As a result, a smooth pattern surface without undulation can be formed, and the reliability of the device can be further enhanced.

The pattern is not predetermined particularly as long as the pattern size is reduced by the water activated by irradiation with light. It may be applied in slimming process of a resin-based insulating film. Further, the silicon nitride film pattern is also reduced in size, and hence the pattern can be formed by this method.

In this embodiment, an example of the resist pattern is shown as a pattern to be slimmed, but the application of the embodiment is not limited to this alone. It can be also applied in removal (regeneration) of the resist film in the event of a defect occurring in the resist pattern. In such a case, the processing time may be set in the condition that the resist pattern disappears in the width direction. If a large pattern is present, the reaction product is removed, and the same process can be repeated.

Sixth Embodiment

Figure 39:
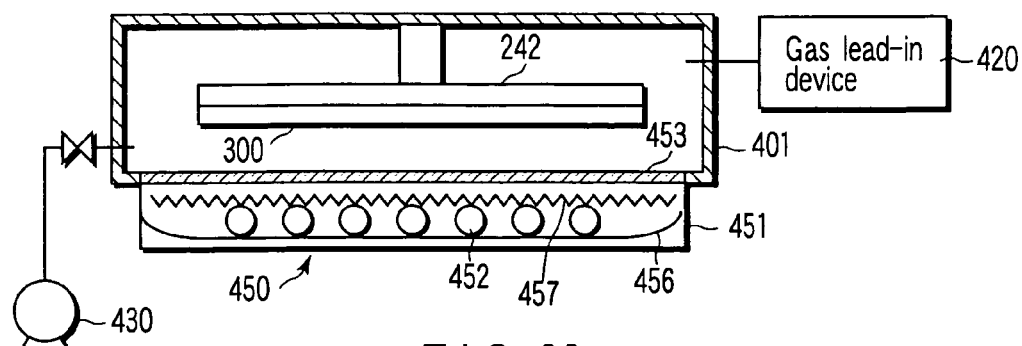
FIG. 39 is a diagram showing a configuration of a substrate-processing apparatus according to a sixth embodiment of the invention.

A configuration of a substrate-processing apparatus for use in slimming process of this embodiment is explained by referring to FIG. 39. Same parts as shown in FIG. 30 are identified with same reference numerals, and detailed description is omitted. The structure of the gas feeder 420 is same as the gas lead-in device shown in FIG. 30.

A holder 242 for holding the wafer 300 with its principal plane downward is provided in the chamber 401. The holder 242 holds the wafer 300 by, for example, vacuum chuck. The holder 242 has a temperature regulating function for adjusting the temperature of the wafer 300. A light emitting section 450 is provided opposite to the principal plane of the wafer 300. The light emitting section 450 includes a lamp house 451, an $Xe_2$ excimer lamp 452 for emitting light of 172 nm, a quartz glass 453, a reflector 456, and a diffusion plate 457.

Slimming process by using the apparatus shown in FIG. 39 is explained below.

First, same as in the fourth embodiment, the resist pattern 302 shown in FIG. 28A is formed (S401).

An antireflective film is formed by a rotation coating method. A solvent is heated and evaporated in the condition of 300° C., 120 seconds, and an anti-reflective film with film thickness of 100 nm is formed. Herein, an organic material was used for the antireflective film. A resist film is formed by the rotation coating method. A solvent is heated and evaporated in the condition of 300° C., 60 seconds, and a resist film with film thickness of 200 nm is formed. The resist film is a chemically amplifying positive resist for ArF light (wavelength: 193 nm). Next, using an ArF excimer laser, a gate processing pattern is exposed by reduction projection by way of an exposure reticle. The substrate is heated, and conveyed into a developing apparatus. In the developing apparatus, a developing solution is supplied onto the substrate to be processed, and after developing for 30 seconds, pure water is supplied while rotating the substrate to be processed, and reaction is stopped and the substrate is cleaned. The substrate to be processed is dried by spin drying. As a result of these steps, an isolated residual pattern of 100 nm is formed on the substrate to be processed.

The substrate is then conveyed into the substrate-processing apparatus shown in FIG. 39. The principal plane of the wafer 300 is directed downward.

After the developing process, the substrate is conveyed into the chamber by a conveying robot, and is irradiated with light, and the resist pattern for gate is processed by slimming.

Nitrogen gas containing pure water of 23° C. and humidity of 70% is supplied form the gas feeder 420. The humidity of the nitrogen gas is adjusted by passing part of the nitrogen gas in a bubbler filled with pure water heated to higher temperature than the temperature of nitrogen gas to be fed, mixing pure nitrogen and water from the bubbler, and adjusting the gas temperature to 23° C.

Slimming is processed by emitting light from the light emitting section 450 to the wafer 300 to be irradiated with light. The output of the lamp 452 was set at 50 mW/cm$^2$, the irradiation time at 30 seconds, and the distance between the quartz glass 453 and wafer 300 at 5 mm. At this time, a vacuum pump was controlled by a valve such that the pressure in the chamber was 19998.3 Pa (150 mmHg).

Figure 40A:
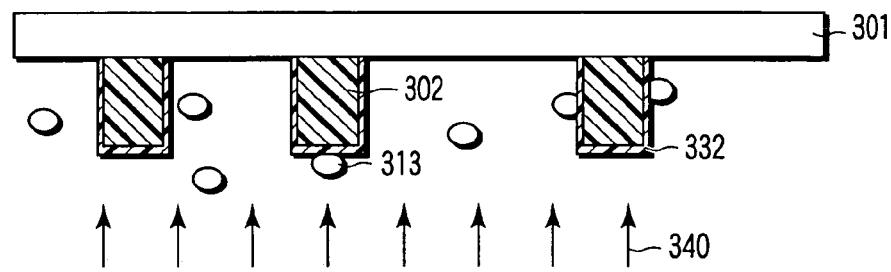
FIGS. 40A to 40C are sectional views showing a method of manufacturing a semiconductor device according to the sixth embodiment.
Figure 40B:
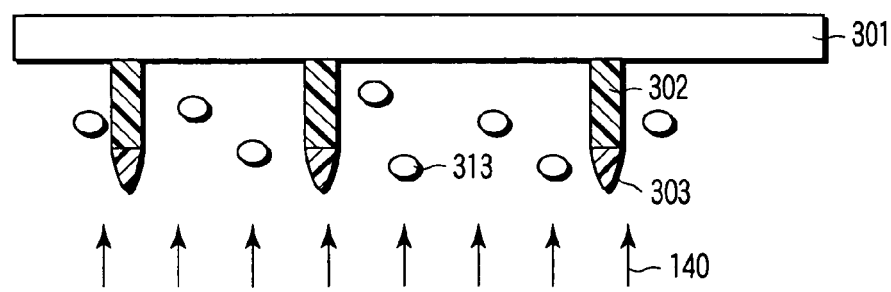
Figure 40C:
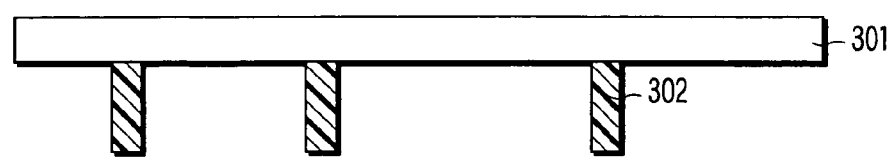

The slimming process in this embodiment is explained by referring to FIGS. 40A to 40C. FIGS. 40A to 40C are sectional views showing a method of manufacturing a semiconductor device according to the sixth embodiment of the invention.

First, as shown in FIG. 40A, vapor in the chamber 401 is irradiated with light, and radical molecules/atoms 313 such as OH radicals and O radicals are produced. The radical molecules/atoms 313 and the resist pattern 302 react with each other, and the reaction product 303 is formed on the resist pattern surface, and the line width of the resist pattern 302 thins out. By radiation heat of the light 340, the reaction product 303 is warmed, and is fluidized. As shown in FIG. 40B, the reaction product 303 in the vicinity of the leading end of the resist pattern 302 is fluidized and is moved to the leading end of the resist pattern 302, so that the reaction is suppressed in the leading end portion of the resist pattern 302. The fluidized reaction product 303 is evaporated, and the resist pattern surface is exposed at the side of the resist pattern 302.

At the time of irradiation with ultraviolet rays, in order that the surface temperature of the resist and antireflective film is less than each pyrolysis temperature, irradiation conditions such as the lamp output, irradiation time, and distance between the quartz glass and the substrate, and temperature regulating function of the holder are controlled.

While removing the reaction product, by illuminating the excimer lamp, reaction of the unreacted resist surface and OH radicals or O radicals is promoted.

The substrate is conveyed into a cleaning unit by a conveying robot, a rinsing solution (for example, pure water) is supplied from a rinsing nozzle provided above the substrate to be processed, and the substrate is rotated and cleaned for 30 seconds, so that the reaction product slightly remaining on the pattern surface layer is dissolved, and a desired pattern is obtained. In this series of process, the resist pattern for gate processing of 100 nm was reduced to 60.5 nm (FIG. 40C). At this time, the resist film thickness was 197 nm and was hardly changed, and since anisotropic etching is applied in the width direction at the time of slimming, a sufficient film thickness to withstand the subsequent etching process is assured.

The device using the gate fabricated by processing such resist pattern into a mask could be processed to a finer size than the gate dimensions used without this processing, and hence an excellent response was obtained.

It is also effective for slimming to repeat several times the series of processes from illumination of the excimer lamp in vacuum pressure to cleaning process. In addition, when executing plural times, it is effective to measure the resist pattern dimension after finishing each session of the series of process. By measuring the resist pattern dimension, the reaction amount is known. Depending on the reaction amount, the irradiation conditions can be changed such as the irradiation amount and irradiation time of the light emitting section, the distance between the quartz glass and the substrate to be processed, and humidity and oxygen concentration in the chamber, and it may be controlled to obtained a desired reaction amount.

In the embodiment, the pressure in the chamber is 19998.3 Pa (150 mmHg), but not limited to this, the pressure may be properly adjusted so as to keep humidity and oxygen concentration enough to product OH radicals and O radicals sufficient for slimming the resist pattern.

In the embodiment, by passing part of nitrogen gas in the bubbler, pure nitrogen and moisture from the bubbler are mixed, and then introduced into the chamber, but the atmosphere in the chamber is not predetermined, and the air mixed with ozone gas, hydrogen peroxide gas or the like may be introduced into the chamber.

Hydrogen peroxide gas can produce OH radicals and O radicals. In particular, hydrogen peroxide gas can produce bimolecular OH radicals from one molecule. On the other hand, since ozone can also produce O radicals, slimming reaction is realized.

The wavelength of the excimer lamp is not predetermined as long as OH radicals and/or O radicals can be produced. The lamp output, irradiation time, and distance from window material to sample are mere examples, and may be set at any desired values as long as reaction is assured. The window material may be also $CaF_2$.

In this embodiment, the forming surface of the resist pattern is downward in the slimming process, but the forming surface of the resist pattern may be also upward in the process. The pattern is not particularly predetermined as long as the pattern size is reduced by the water activated by illumination with light. It is also applied in slimming process of a resin-based insulating film. The silicon nitride film pattern is also reduced in size and the pattern can be formed by this method.

Seventh Embodiment

In this embodiment, there is explained an example in which the resist pattern is slimmed by illuminating the excimer lamp after forming the resist pattern, same as in the fourth to sixth embodiments.

A resist pattern is formed in the same condition as in the sixth embodiment.

The substrate to be processed is conveyed into the chamber 401 of the substrate-processing apparatus shown in FIG. 39 by means of a conveying robot. The wafer 300 is held with its principal plane (resist pattern forming side) downward.

The subsequent procedure is explained by referring to FIGS. 41A to 41D. FIGS. 41A to 41D are sectional views showing a process of manufacturing a semiconductor device according to the seventh embodiment of the invention.

Nitrogen gas containing pure water of 23° C. and humidity of 70% is supplied from gas feeding means. Humidity was adjusted by nitrogen gas by passing part of the nitrogen gas in a bubbler filled with pure water heated to higher temperature than the temperature of nitrogen gas to be fed, and mixing pure nitrogen and vapor from the bubbler. The pressure in the chamber 401 is set at atmospheric pressure. The temperature of the substrate to be processed is adjusted to 0° C. As shown in FIG. 41A, on the surface of the resist pattern 302, the introduced moisture condenses dew by temperature difference, and an adsorption film 332 of water is formed on the resist pattern surface.

By emitting light 340 from the light emitting section 450, active OH radicals or O radicals are produced, and the resist pattern is slimmed by the produced radicals. In this embodiment, light of an $Xe_2$ excimer lamp with wavelength of 172 nm was used. The lamp output was set at 50 mW/cm$^2$, the irradiation time at 20 seconds, and the distance between the quartz glass and the substrate at 5 mm.

By illuminating the excimer lamp, OH radicals or O radicals are produced from the adsorption film 332 of water, and the reaction between the resist pattern and the radicals is promoted. On the other hand, since the temperature of the pattern surface is raised by reaction heat by irradiation with light, the fluidity of the reaction product 303 is increased, and it is formed like an icicle (FIG. 41B). The leading end of the resist pattern 302 is protected by the icicle-like reaction product 303, and etching in the thickness direction is suppressed.

Temporarily stopping illumination of light, the wafer 300 is heated to 50° C., and the pressure in the chamber is evacuated to 19998.3 Pa (150 mmHg). As shown in FIG. 41C, by heating the substrate 301 in vacuo, the icicle-like reaction product 303 is evaporated, and an unreacted resist appears on the surface layer of the resist pattern 302. At this time, the process time is adjusted such that the reaction product 303 at the leading end of the resist pattern 302 is not removed.

By repeating the series of processes of cooling of the substrate to be processed 301, illumination of the excimer lamp, and heating of the substrate to be processed in vacuo, the reaction product 303 is removed, and reaction of unreacted resist surface and OH radicals or O radicals can be promoted. By illumination of the excimer lamp, the surface temperature of the resist is elevated. The illumination conditions such as lamp output, irradiation time, and distance between quartz glass and the substrate are controlled such that this surface temperature is kept less than the pyrolysis temperature of the resist and antireflective film.

The substrate is conveyed into a cleaning unit by a conveying robot, a rinsing solution (for example, pure water) is supplied from a rinsing nozzle provided above the substrate to be processed, and the substrate is rotated and cleaned for 30 seconds, so that the reaction product slightly remaining on the pattern surface layer is dissolved, and a desired pattern is obtained (FIG. 41D). In this series of processes, the resist pattern for gate processing of 100 nm was reduced to 50 nm. At this time, the resist film thickness was 197.5 nm and was hardly changed, and since anisotropic etching is applied in the width direction at the time of slimming, a sufficient film thickness to withstand the subsequent etching process is assured.

The device using the gate fabricated by processing such resist pattern into a mask could be processed to a finer size than the gate dimensions used without this processing, and hence an excellent response was obtained.

In the embodiment, by cooling the substrate to be processed, water molecules are adsorbed on the resist surface, and by heating the substrate to be processed in vacuo, the reaction product is removed from the resist pattern surface. However, the method of promoting the reaction of the OH radicals or O radicals and the resist pattern surface layer is not limited to this method alone. While keeping the temperature of the substrate to be processed constant, by raising the pressure in the chamber, water molecules can be adsorbed on the resist pattern surface, and after illuminating the excimer lamp, the chamber can be evacuated, so that the reaction product produced by OH radicals or O radicals can be vaporized. In addition, the resist pattern can be finely processed by controlling the pressure in the chamber before and after illumination of the excimer lamp.

The wavelength of the excimer lamp is not predetermined as long as OH radicals and/or O radicals can be produced. The lamp output, irradiation time, and distance from window material to sample are mere examples, and may be set at any desired values as long as reaction is assured. The window material may be also $CaF_2$.

It is also effective for slimming to repeat several times of the series of process from cooling of the substrate to be processed to cleaning process. In addition, when executing plural times, it is effective to measure the resist pattern dimension after finishing each session of the series of process.

In the embodiment, by passing part of the nitrogen gas in a bubbler, pure nitrogen and steam from the bubbler are mixed and introduced into the chamber. However, the atmosphere in the chamber is not particularly predetermined same as in the first embodiment, and the air mixed with ozone gas, hydrogen peroxide gas or the like may be introduced into the chamber.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method comprising:
forming a photosensitive resin film on a substrate;
exposing the photosensitive resin film;
forming a pattern of the photosensitive resin film by supplying a developing solution to the photosensitive resin film; and
slimming to remove a surface layer of the pattern by causing the pattern to contact with an activated water, wherein the activated water contains radicals of atoms or molecules produced by irradiating the water with light.

2. The pattern forming method according to claim 1, wherein the light includes wavelength of 250 nm or less.

3. The pattern forming method according to claim 1, wherein a pattern dimension is measured before the slimming, and the condition of the slimming is determined on the basis of the result of measurement.

4. The pattern forming method according to claim 3, wherein the pattern dimension is measured by emitting a measuring light to a measuring region of the substrate, and determining on the basis of any one of the diffracted light intensity from the measuring region, wavelength dispersion of the diffracted light intensity, and wavelength dispersion of polarized light information of the diffracted light.

5. The pattern forming method according to claim 1, wherein the slimming is followed by one or more repetitions of a re-slimming process of removing a surface layer of the pattern by causing the pattern to contact with the activated water.

6. The pattern forming method according to claim 5, wherein a pattern dimension is measured before the re-slimming process.

7. The pattern forming method according to claim 6, wherein the pattern dimension is measured by emitting a measuring light to a measuring region of the substrate, and determining on the basis of any one of the diffracted light intensity from the measuring region, wavelength dispersion of the diffracted light intensity, and wavelength dispersion of polarized light information of the diffracted light.

8. The pattern forming method according to claim 7, wherein the condition of the re-slimming process is determined on the basis of the result of measurement of the measured pattern dimension.

9. The pattern forming method according to claim 7, wherein the re-slimming process is stopped at the time when the measured pattern dimension reaches a desired dimension.

10. The pattern forming method according to claim 1, wherein a pattern dimension is measured along with the slimming, and the slimming process is stopped at the time when the measured pattern dimension reaches a desired dimension.

11. The pattern forming method according to claim 1, wherein, after forming the pattern, a cleaning solution is supplied on the substrate in which the developing solution is supplied, and the slimming is executed while the cleaning solution is left over on the substrate.

12. The pattern forming method according to claim 1, wherein, after forming the pattern, a cleaning solution is supplied on the substrate in which the developing solution is supplied, and the slimming is executed after the cleaning solution is removed from the substrate.

13. The pattern forming method according to claim 1, further comprising, after the slimming:
supplying carbon dioxide in a supercritical state on the substrate to dissolve the water on the substrate; and
drying the substrate while varying the pressure and temperature such that the carbon dioxide in the supercritical state is transformed into a gaseous state without transition of a liquid state.

14. The pattern forming method according to claim 1, further comprising, after the slimming:
transforming the water into a supercritical state while varying the pressure and temperature such that the activated water is not vaporized; and
drying the substrate while varying the pressure and temperature such that the water in the supercritical state is transformed into a gaseous state without transition of a liquid state.

15. The pattern forming method according to claim 1, further comprising stopping developing action by supplying the water onto the photosensitive resin film after forming the pattern.

16. The pattern forming method according to claim 1, wherein the activated water is produced by moving the light along the water.

17. A pattern forming method comprising:
forming a photosensitive resin film on a substrate;
exposing the photosensitive resin film;
forming a pattern of the photosensitive resin film by supplying a developing solution to the photosensitive resin film; and
slimming to remove a surface layer of the pattern by causing the pattern to contact with an activated water, wherein the activated water contains radicals produced by irradiating the water in which molecules of gas are dissolved, with light.

18. The pattern forming method according to claim 17, wherein, when hydrogen peroxide is selected as the molecules of gas, the light includes wavelength of 300 nm or less.

19. The pattern forming method according to claim 17, wherein, when oxygen or ozone is selected as the molecules of gas, the light includes wavelength of 250 nm or less.

20. The pattern forming method according to claim 17, wherein the activated water is ozone water having ozone dissolved in pure water, and the pattern surface is oxidized by 5 nm or more with the ozone water.

21. A pattern forming method comprising:
forming a photosensitive resin film on a substrate;
exposing a pattern on the photosensitive resin film;
reforming a surface layer of the photosensitive resin film by causing the the photosensitive resin film to contact with an activated water; and
developing the photosensitive resin film by supplying a developing solution to the photosensitive resin film to form the pattern of the photosensitive resin film and to remove the reformed surface layer,
wherein the activated water contains radicals of atoms or molecules produced by irradiating the water with light, and
wherein the developing of the photosensitive resin film and removing of the reformed surface layer is followed by a re-reforming process of reforming the surface layer of the photosensitive resin film by causing the pattern to contact with the activated water, and a re-developing process of removing the reformed surface layer of the pattern by supplying a developing solution to the re-reformed pattern.

22. The pattern forming method according to claim 21, wherein the light includes wavelength of 250 nm or less.

23. The pattern forming method according to claim 21, wherein a pattern dimension is measured before the re-reforming process.

24. The pattern forming method according to claim 23, wherein the condition of the re-reforming process and re-developing process is determined on the basis of the measured pattern dimension.

25. The pattern forming method according to claim 23, wherein the pattern dimension is measured by emitting a measuring light to a measuring region of the substrate, and determining on the basis of any one of the diffracted light intensity from the measuring region, wavelength dispersion of the diffracted light intensity, and wavelength dispersion of polarized light information of the diffracted light.

26. A pattern forming method comprising:
    forming a photosensitive resin film on a substrate;
    exposing a pattern on the photosensitive resin film;
    reforming a surface layer of the photosensitive resin film by causing the pattern to contact with an activated water; and
    developing the photosensitive resin film by supplying a developing solution to the photosensitive resin film to form the pattern of the photosensitive resin film,
    wherein the activated water contains radicals produced by irradiating the water in which molecules of gas are dissolved, with light, and
    wherein, when hydrogen peroxide is selected as the molecules of gas, the light includes a wavelength of 300 nm or less.

27. The pattern forming method according to claim 26, wherein, when oxygen or ozone is selected as the molecules of gas, the light includes wavelength of 250 nm or less.

28. The pattern forming method according to claim 26, wherein the activated water is ozone water having ozone dissolved in pure water, and the pattern surface is oxidized by 5 nm or more with the ozone water.

29. A pattern forming method comprising:
    forming a photosensitive resin film on a substrate;
    exposing the photosensitive resin film;
    slimming a surface layer of the photosensitive resin film by causing the photosensitive resin film to contact with an activated water containing radicals produced by irradiating the water in which molecules of gas are dissolved, with light; and
    forming a pattern of the photosensitive resin film by supplying a developing solution to the photosensitive resin film of which surface layer has been slimmed,
    wherein, when hydrogen peroxide is selected as the molecules of gas, the light includes a wavelength of 300 nm or less.

30. The pattern forming method according to claim 29, wherein, when oxygen or ozone is selected as the molecules of gas, the light includes wavelength of 250 nm or less.

31. A pattern forming method comprising:
    forming a photosensitive resin film on a substrate;
    exposing the photosensitive resin film;
    reforming a surface layer of the photosensitive resin film by causing the photosensitive resin film to contact with an activated water; and
    forming a pattern of the photosensitive resin film by supplying a developing solution to the photosensitive resin film of which surface layer has been reformed,
    wherein the activated water contains radicals produced by irradiating the water in which molecules of gas are dissolved, with light, and
    wherein, when hydrogen peroxide is selected as the molecules of gas, the light includes a wavelength of 300 nm or less.

32. The pattern forming method according to claim 31, wherein when oxygen or ozone is selected as the molecules of gas, the light includes wavelength of 250 nm or less.

* * * * *

UNITED STATES PATENT AND TRADEMARK OFFICE
CERTIFICATE OF CORRECTION

PATENT NO. : 7,364,839 B2
APPLICATION NO. : 10/624593
DATED : April 29, 2008
INVENTOR(S) : Hayasaki et al.

It is certified that error appears in the above-identified patent and that said Letters Patent is hereby corrected as shown below:

* Claim 3, column 29, line 24, change "detennined" to --determined--.

Claim 21, column 30, line 54, change "the the" to --the--.

Signed and Sealed this

Twenty-ninth Day of July, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,364,839 B2 | Page 1 of 1 |
| APPLICATION NO. | : 10/624593 | |
| DATED | : April 29, 2008 | |
| INVENTOR(S) | : Kei Hayasaki et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 0 days.

Signed and Sealed this
Nineteenth Day of April, 2011

David J. Kappos
*Director of the United States Patent and Trademark Office*